(12) United States Patent
Verma et al.

(10) Patent No.: US 12,411,171 B2
(45) Date of Patent: Sep. 9, 2025

(54) BUILT-IN SELF-TEST ENHANCEMENTS

(71) Applicant: QUALCOMM Incorporated, San Diego, CA (US)

(72) Inventors: Gaurav Verma, Noida (IN); Saksham Tandon, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 74 days.

(21) Appl. No.: 18/189,859

(22) Filed: Mar. 24, 2023

(65) Prior Publication Data

US 2024/0319268 A1    Sep. 26, 2024

(51) Int. Cl.
| | | |
|---|---|---|
| G01R 31/317 | (2006.01) | |
| B60L 3/00 | (2019.01) | |
| G01R 31/3183 | (2006.01) | |
| G01R 31/3187 | (2006.01) | |
| G06F 11/27 | (2006.01) | |
| G11C 29/16 | (2006.01) | |

(52) U.S. Cl.
CPC ...... *G01R 31/31724* (2013.01); *B60L 3/0084* (2013.01); *G01R 31/318335* (2013.01); *G01R 31/3187* (2013.01); *G06F 11/27* (2013.01); *G11C 29/16* (2013.01)

(58) Field of Classification Search
CPC ............ G06F 11/27; G01R 31/318335; G01R 31/318547; G01R 31/31813; G01R 31/31921; G01R 31/318385; G01R 31/3187; G01R 31/31724; G11C 2029/3602; G11C 29/10; G11C 29/40; G11C 29/56004; G11C 29/16; B60L 3/0084
See application file for complete search history.

(56) References Cited

U.S. PATENT DOCUMENTS

| | | | | |
|---|---|---|---|---|
| 2001/0002483 | A1* | 5/2001 | Roberts | ............... G06F 9/30185 712/213 |
| 2013/0132710 | A1* | 5/2013 | Coulon | ............... G06F 9/30181 712/226 |
| 2018/0143770 | A1* | 5/2018 | Arelakis | ................. H03M 7/30 |

* cited by examiner

*Primary Examiner* — Thien Nguyen
(74) *Attorney, Agent, or Firm* — Patterson + Sheridan, L.L.P.

(57) ABSTRACT

Aspects of the present disclosure provide a method generally including obtaining one or more built-in self-test (BIST) patterns, each pattern including a series of instructions, applying a compression scheme to generate one or more compressed BIST patterns, wherein the compression scheme encodes an operation and data field of instructions to generate encoded instructions, each encoded instruction having an identifier (ID) field and a variable number of data bytes, wherein the ID field identifies a type of the operation and indicates the variable number of data bytes, and storing the compressed BIST patterns.

28 Claims, 17 Drawing Sheets

Compressed Instruction, based on a 5-Byte Compression Scheme

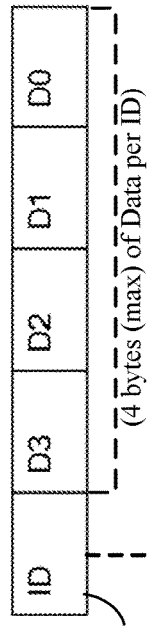

| Bit(s) | Definition (ID[2] = 0) | Bit(s) | Definition (ID[2] = 1) |
|---|---|---|---|
| 1:0 | 00: Write<br>01: Read<br>10: Delay<br>11: Reserved | 1:0 | 00: Write Repeat<br>01: Read Repeat<br>10: Delay Repeat<br>11: BIST SS ID |
| 2 | SEC_ID = 0 | 2 | SEC_ID = 1 |
| 3 | 0: Conf Reg (MBIST or LBIST)<br>1: Data Reg (MBIST or LBIST)<br>* MBIST or LBIST identification is done via info in pattern | 3 | Reserved |
| 7:4 | 0: Dn is non-zero data byte<br>1: Dn is zero byte and do not need storage | 7:4 | 0: Dn is non-zero data byte<br>1: Dn is zero byte and do not need storage |

FIG. 4

BUILT-IN SELF-TEST ENHANCEMENTS

BACKGROUND

Field of the Disclosure

Certain aspects of the present disclosure generally relate to enhancements for built-in self-test storage and execution.

Description of Related Art

Certain mechanisms (e.g., devices, machines, vehicles, and/or software) undergo built-in self-tests (BISTs), for example, in any of various applications, such as automotive, aircraft, spacecraft, watercraft, medical, electronic, and/or military applications. A BIST is where a mechanism tests itself to ensure the mechanism is operating as expected. The BIST may be performed to ensure high reliability of the mechanism's performance. In some cases, the BIST may be performed to reduce repair cycle times, testing during manufacture, and/or testing with external test equipment. In other cases, the BIST can also be used to monitor a device over time and detect any changes in its performance that may indicate a current of future malfunction. The BIST may be performed to comply with certain functional safety standards, such as ISO 26262 associated with automotive applications as provided by the International Organization for Standardization (ISO).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

One aspect provides a method, comprising: obtaining one or more built-in self-test (BIST) patterns, each pattern including a series of instructions; applying a compression scheme to generate one or more compressed BIST patterns, wherein the compression scheme encodes an operation and data field of instructions to generate encoded instructions, each encoded instruction having an identifier (ID) field and a variable number of data bytes, wherein the ID field identifies a type of the operation and indicates the variable number of data bytes; and storing the compressed BIST patterns.

One aspect provides a method, comprising: obtaining an encoded instruction of a compressed built-in self-test (BIST) pattern, the compressed BIST pattern including a series of encoded instructions, the encoded instruction having an identifier (ID) field and a variable number of data bytes, wherein the ID field identifies a type of the operation and indicates the variable number of data bytes; applying a decompression scheme to generate a decoded instruction from the encoded instruction, wherein the decompression scheme decodes the ID field of the encoded instruction to reconstruct an operation and data field of the decoded instruction; and executing the decoded instruction.

One aspect provides a method, comprising: obtaining information regarding a plurality of logical built-in self-tests (LBISTs) to be run on processing cores distributed across multiple subsystems; determining, based on the information, a first processing core with a longest remaining test time among a set of the processing cores that are waiting in a scheduler queue to access a server interface for LBIST dispatch; and giving the first processing core priority in the scheduler queue to access the server interface.

One aspect provides a method, comprising: obtaining information regarding a plurality of logical built-in self-tests (LBISTs) to be run on processing cores distributed across multiple subsystems; determining, based on the information, a power consumption related metric for each of the LBISTs; and scheduling the LBISTs for executing on the processing cores based on the power consumption related metrics and subject to a power constraint for concurrent execution.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 4 depicts an example encoding scheme for BIST pattern compression, in accordance with aspects of the present disclosure.

DETAILED DESCRIPTION

Figure 1:
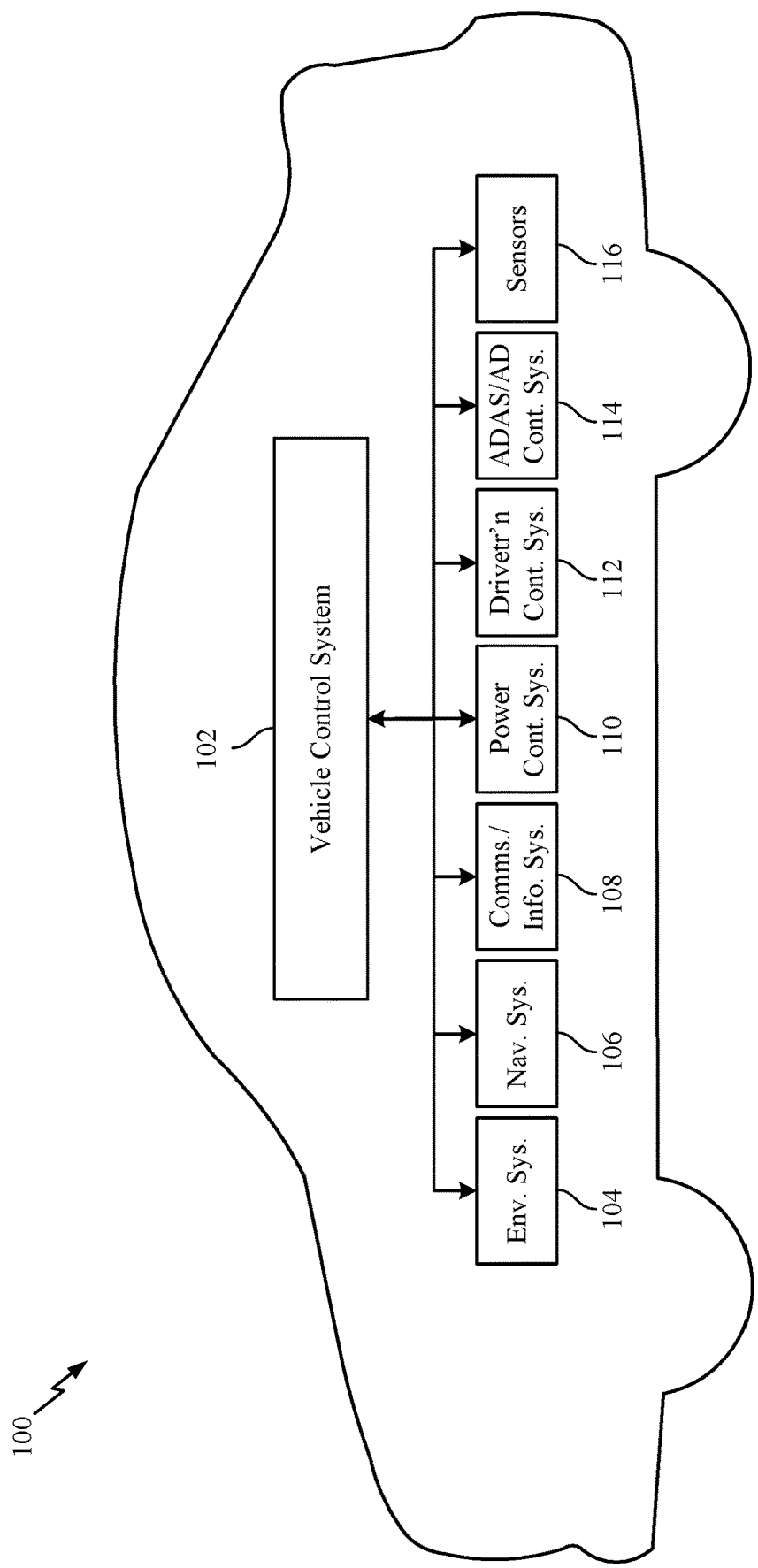
FIG. 1 depicts a diagram of an example vehicle with a vehicle control system.

Built-In Self-Test (BIST) generally refers to a system-level testing technique used to validate the functionality of integrated circuits (ICs) and other electronic devices. For example, logic BIST (LBIST) and memory-BIST may test the internal functionality of logic and memory circuits of a device under test (DUT) by executing a set of predefined test patterns to check for defects and faults. BIST test patterns may be generated and executed by a BIST controller, which is an on-chip module integrated into the DUT. Being integrated into the DUT allows for faster, more efficient testing of the device, as well as reduced cost and improved reliability, since the testing process can be automated and performed on-chip. BIST can be applied to various types of ICs and electronic devices, including microprocessors, memory chips, digital signal processors (DSPs), and application-specific integrated circuits (ASICs). BIST may also be used to monitor the device over time and detect any changes in its performance that may indicate a malfunction or system failure.

To verify correct operation of certain circuits and/or ensure the detection of latent faults, a circuit may occasionally undergo a BIST. For example, electrical components associated with automotive safety systems (e.g., certain advanced driver assistance system (ADAS) and/or automated driving (AD) systems), may undergo BISTs to ensure the correct operation of such electrical components, such as memory, a processor, control logic, a power management circuit, a voltage regulator, current regulator, etc. ADAS and/or AD systems have generally increased driver and passenger safety, but can cause harm to passengers or bystanders if these systems malfunction.

Measures to detect such faults are designed in line with a particular automotive safety integrity level (ASIL), for example, as per functional safety standard, such as ISO 26262 for automotive applications as provided by the International Organization for Standardization (ISO). It will be appreciated that BISTs may be performed in any of various applications, such as automotive, aircraft, spacecraft, watercraft, medical, electronic, and/or military applications.

Increased design complexity in certain devices, such as advanced automotive system on a chip (SoCs), increases the amount of code memory for BISTs, such as LBISTs and memory BISTs. This is often due to the time consuming nature of serial execution of BIST patterns. While concurrent execution of BIST patterns may help reduce execution time, without proper power consideration, concurrent execution may led to excess current consumption.

Aspects of the present disclosure, however, may help address these issues. As an example, certain aspects of the present disclosure propose a BIST compression scheme that may significantly reduce the amount of memory involved (e.g., for core source code). As another example, certain aspects of the present disclosure provide mechanisms for scheduling concurrent BIST execution that may significantly reduce execution time. In some cases, such mechanisms may take power consumption into consideration, which may help achieve reductions in execution time while still avoiding excess current consumption.

By reducing BIST execution time, aspects of the present disclosure may help reduce overall (automotive system) boot time of certain systems, which may result in improved overall performance and user experience.

Example Vehicle Control System

FIG. 1 is a block diagram of an example vehicle 100 including a vehicle control system 102 and various sensors suitable for controlling certain systems, such as an ADAS, an AD, and/or an in-vehicle infotainment (IVI). The vehicle 100 may refer to a means of carrying or transporting something (e.g., a person and/or cargo). In some aspects, the vehicle 100 may represent a motor vehicle, such as a car, van, truck, semitruck, motorcycle, motorbike, moped, electric bicycle, etc. The vehicle 100 may be a series production road vehicle having safety-related systems that include one or more electrical and/or electronic systems, as further described herein. The vehicle 100 may use an internal combustion engine, an electric motor, or a hybrid propulsion system (e.g., a combination of an engine and an electric motor) for propulsion. In some cases, the vehicle 100 may have one or more electrical and/or electronic systems that comply with certain functional safety standards, such as ISO 26262 as provided by the ISO.

Figure 2:
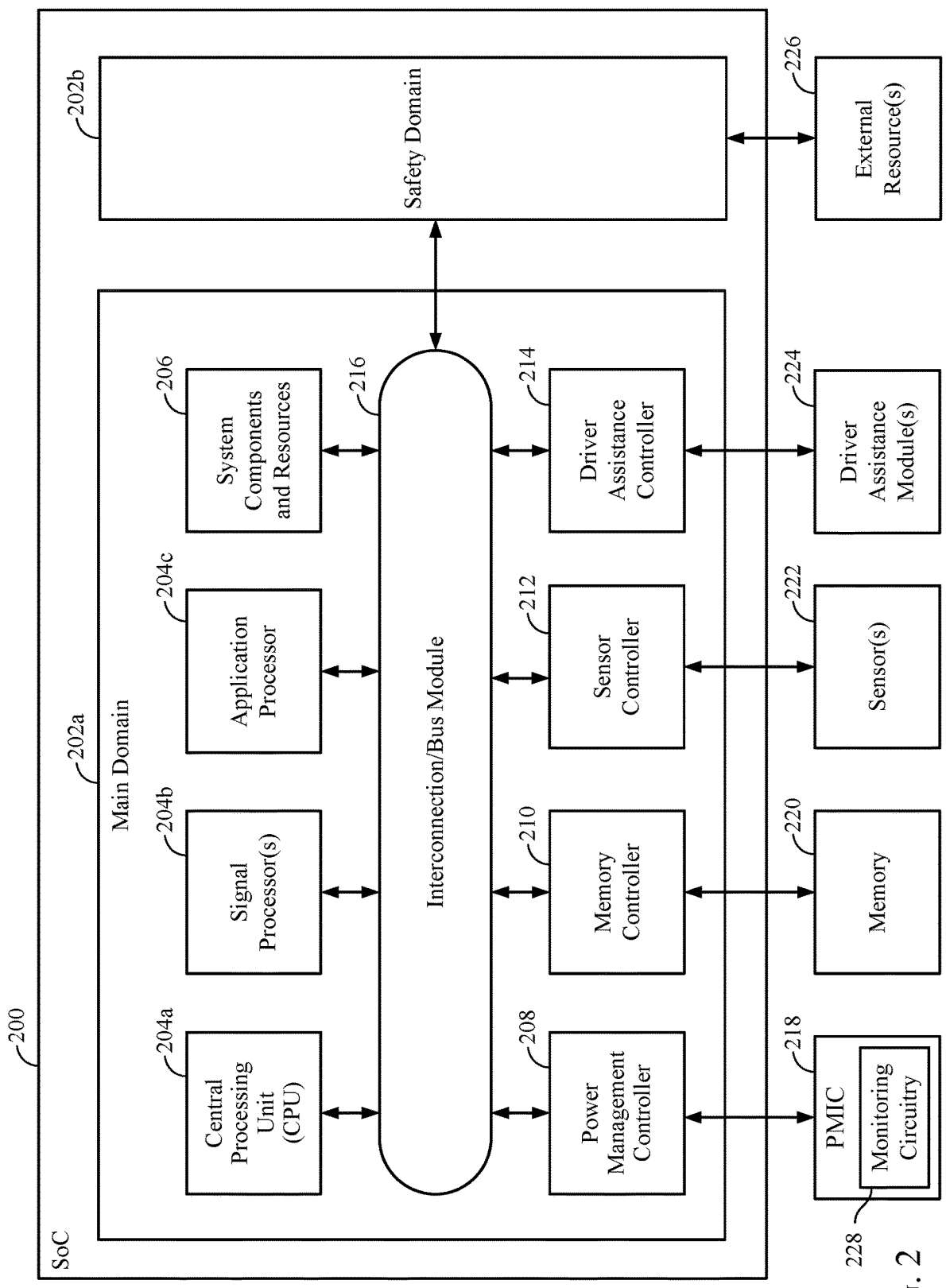
FIG. 2 depicts a block diagram of an example of a circuit architecture with logic for performing a built-in self-test (BIST).

The vehicle control system 102 may include one or more computing devices having system-on-chips (SoCs) (e.g., one or more electronic control units (ECUs)) as further described herein with respect to FIG. 2. The vehicle control system 102 may be coupled to a variety of vehicle systems and subsystems, such as an environmental system 104 (e.g., an air conditioning and/or heating system), a navigation system 106, a communications and/or infotainment system 108, a power control system 110, a drivetrain control system 112, a driver assistance and/or automated driving control system 114, and/or a variety of sensors 116. Each of the vehicle systems and sensors 102-116 may communicate with one or more other systems via one or more communication links, which may include wired communication links (e.g., a Controller Area Network (CAN) protocol compliant bus, Universal Serial Bus (USB) connection, Ethernet connection, universal asynchronous receiver-transmitter (UART), etc.) and/or wireless communication links (e.g., a Wi-Fi® link, Bluetooth® link, ZigBee® link, ANT+® link, Evolved Universal Terrestrial Radio Access (E-UTRA), Fifth Generation (5G) New Radio, etc.).

The vehicle control system 102 may perform certain operations associated with any of the vehicle systems and subsystems. For example, the vehicle control system 102 may control or initiate the power-on and/or shutdown sequence for any of the vehicle systems and subsystems. The vehicle control system 102 may monitor for errors associated with any of the vehicle systems and subsystems, and in some cases, the vehicle control system 102 may store the errors for vehicle diagnostics. In response to any errors detected, the vehicle control system 102 may perform certain actions, such as shutting down the affected system or transferring some of the affected operations to be performed at a different vehicle system. The vehicle control system 102 may monitor the power levels supplied to any of the vehicle systems and subsystems and ensure that the power levels supplied satisfy the operating specifications for any of the vehicle systems and subsystems.

The environmental system 104 may control the cooling and/or heating systems associated the vehicle 100. For example, the vehicle 100 may have an air conditioning system, a heating system, heated or cooled seat(s), and/or a heated steering wheel; and the environmental system 104 may adjust the temperature according to user (or default) settings for the respective cooling and/or heating components. The navigation system 106 may show the vehicle's location on a map and provide navigation information, such as directions to a destination, via a display (not shown).

The communications and/or infotainment system 108 may allow the user to access various information (e.g., navigation information, interior or exterior environmental information, ADAS information, etc.), applications, and/or entertainment or media content, such as music and/or videos. The communications and/or infotainment system 108 may allow the user to update or access settings associated with a variety of systems, such as the environmental system 104, the navigation system 106, ADAS, vehicle settings, etc. The communications and/or infotainment system 108 may allow the user and/or vehicle 100 to wirelessly communicate via an integrated modem of the vehicle or via the user's wireless communication device (e.g., a smartphone or tablet).

The power control system 110 may control the components that output power to move the vehicle, such as an internal combustion engine (e.g., adjusting the air-fuel ratio, boost pressure, valve timing, etc.), an electric power system (e.g., controlling regenerative braking, battery power output, battery charging, and/or battery cooling, etc.), and/or a hybrid power system (e.g., controlling regenerative braking, switching between battery power and engine power, battery charging, battery cooling, etc.). The drivetrain control system 112 may control the various components of the vehicle 100 that deliver power to the drive wheels. For example, the drivetrain control system 112 may control gear shifting in an automatic transmission. For a four-wheel drive vehicle, the drivetrain control system 112 may control the power ratio applied to the front and rear drive wheels.

The driver assistance and/or automated driving control system 114 may control various driver assistance features and functions, such as adaptive cruise control, automated lane detection, lane departure warning, automated steering, automated braking, and automated collision avoidance. The driver assistance and/or automated driving control system 114 may control automated driving at various levels of automation, such as any of the Society of Automotive Engineers (SAE) levels 1 through 5.

The variety of sensors 116 coupled to the vehicle control system 102 may include any of the vehicle's speedometer, a wheel speed sensor, a torque meter, a turbine speed sensor, a variable reluctance sensor, a sonar system, a radar system, an air-fuel ratio meter, a water-in-fuel sensor, an oxygen sensor, a crankshaft position sensor, a curb feeler, a temperature sensor, a Hall effect sensor, a manifold absolute pressure sensor, various fluid sensors (e.g., engine coolant sensor, transmission fluid sensor, etc.), a tire-pressure monitoring sensor, a mass airflow sensor, a speed sensor, a blind spot monitoring sensor, a parking sensor, cameras, microphones, accelerometers, compasses, a global navigation satellite system (GNSS) receiver (e.g., a global positioning system (GPS) receiver or a Galileo receiver), radar, LiDAR, and other similar sensors for monitoring physical or environmental conditions in and around the vehicle.

The aforementioned systems are presented merely as examples, and vehicles may include one or more additional systems that are not illustrated for clarity. Additional systems may include systems related additional other functions of the vehicular system, including instrumentation, airbags, cruise control, other engine systems, stability control parking systems, tire pressure monitoring, antilock braking, active suspension, battery level and/or management, and a variety of other systems.

Example System-On-A-Chip

The term "system-on-a-chip" (SoC) is used herein to refer to a single integrated circuit (IC) chip that contains multiple resources and/or processors integrated on a single substrate or in a single package. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, flash, etc.), and resources (e.g., timers, voltage regulators, oscillators, etc.). A SoC may also include software for controlling the integrated resources and processors, as well as for controlling peripheral devices.

FIG. 2 is a block diagram of example components and interconnections in a system-on-a-chip (SoC) 200 suitable for implementing various aspects of the present disclosure. For example, SoC 200 may have BIST logic designed to perform enhanced BIST operations described herein.

The SoC 200 may include multiple processing domains having, for example, a main domain 202a and a safety domain 202b (also referred to as a "safety island (SAIL)"). The main domain 202a may be configured to support (or capable of performing) vehicle operations (e.g., driver assistance and/or automated driving operations, features, etc.) up to a specific automotive safety integrity level (ASIL), and the safety domain 202b may be configured to support (or capable of performing) vehicle operations up to a lower, the same, or a higher ASIL than the main domain 202a. For example, the main domain 202a may be configured to support (or capable of performing) vehicle operations up to an ASIL B, and the safety domain 202b may be configured to support vehicle operations up to an ASIL D. In some cases, the main domain 202a may be configured to support (or capable of performing) vehicle operations up to an ASIL A. B, C, or D; and the safety domain 202b may be configured to support vehicle operations up to a different ASIL than the main domain 202a. In certain cases, the main domain 202a and the safety domain 202b may be configured to support (or capable of performing) vehicle operations at the same ASIL (e.g., ASIL D). The main domain 202a and the safety domain 202b may be configured to support (or capable of performing) vehicle operations at different ASILs.

The ASILs may be defined in a specific safety standard, such as ISO 26262. For example, the ASILs may provide a risk classification scheme for certain electrical and electronic systems of road vehicles. ISO 26262 provides four ASILs including ASIL A. ASIL B. ASIL C, and ASIL D. ASIL D is the highest classification and corresponds to the highest level of safety measures for avoiding an unreasonable residual risk, and ASIL A is the lowest classification and corresponds to the lowest level of safety measures.

In certain aspects, the SoC 200 may be included in a computing device (e.g., an ECU) in a vehicle control system.

The SoC 200 may control any of the systems described herein with respect FIG. 1. For example, the SoC 200 may be configured to control an ADAS/AD system, such as the driver assistance and/or automated driving control system 114 described herein with respect to FIG. 1. In certain aspects, the SoC 200 may be in communication with other ECU(s) in a vehicle control system, such as the control system described herein with respect to FIG. 1. For example, the main domain 202a may control the environmental system, the infotainment system, and driver assistance features up to a certain ASIL; and the safety domain 202b may control driver assistance features up to a certain ASIL, which may typically be higher than the main domain 202a.

The main domain 202a and/or safety domain 202b may include a number of heterogeneous processors 204a-c (collectively processors 204), such as a central processing unit (CPU) 204a, signal processor(s) or other specialized processor(s) 204b (e.g., a digital signal processor, an image signal processor, a neural network signal processor, computer vision processor, a graphics processing unit (GPU), etc.), and/or an application processor 204c. Each processor 204 may include one or more cores, and each processor/core may perform operations independent of the other processors/cores. Each processor 204 may be part of a subsystem (not shown) including one or more processors, caches, etc. configured to handle certain types of tasks or computations. It should be noted that the main domain 202a and/or safety domain 202b may include additional processors (not shown) or may include fewer processors (not shown). The main domain 202a and/or safety domain 202b may include other processors (e.g., a graphics processing unit, a vision processing unit, etc.) in addition to or instead of those illustrated.

The main domain 202a and/or safety domain 202b may include system components and resources 206 for performing certain specialized operations, such as analog-to-digital conversions and/or wireless data transmissions. The system components and resources 206 may include components such as voltage regulators, oscillators, phase-locked loops, peripheral bridges, data controllers, system controllers, access ports, timers, and other similar components used to support the processors and software clients running on the SoC 200. The system components and resources 206 may include circuitry for interfacing with peripheral devices, such as cameras, electronic displays, wireless communication devices, external memory chips, etc.

The main domain 202a and/or safety domain 202b may further include a power management controller 208, a memory controller 210 (e.g., a dynamic random access memory (DRAM) memory controller and/or a non-volatile memory controller), a sensor controller 212, and/or a driver assistance controller 214. The main domain 202a and/or safety domain 202b may also include an input/output (IO) module (not shown) for communicating with resources external to the SoC, such as a clock and a voltage regulator, each of which may be shared by two or more of the internal SoC components. The IO module may include a general purpose IO (GPIO) interface, for example. In certain aspects, each of the main domain 202a and the safety domain 202b may have a separate clock to facilitate independent operability.

The processors 204 of the main domain 202a may be interconnected to the system components and resources 206, the power management controller 208, the memory controller 210, the sensor controller 212, the driver assistance controller 214, other system components, and/or the safety domain 202b via an interconnection/bus module 216, which may include an array of reconfigurable logic gates and/or implement a bus architecture (e.g., CoreConnect, advanced microcontroller bus architecture (AMBA), etc.). Communications may be provided by advanced interconnects, such as high performance networks-on-chip (NoCs).

The interconnection/bus module 216 may include or provide a bus mastering system configured to grant SoC components (e.g., processors, peripherals, etc.) exclusive control of the bus (e.g., to transfer data) for a set duration, number of operations, number of bytes, etc. In certain aspects, the bus module 216 may include a direct memory access (DMA) controller (not shown) that enables components connected to the bus module 216 to operate as a master component and initiate memory transactions. The bus module 216 may implement an arbitration scheme to prevent multiple master components from attempting to drive the bus simultaneously.

The power management controller 208 may manage the power supplied to the main domain 202a from a PMIC 218, which may be representative of one or more PMIC(s). The power management may be separate and independent between the main domain 202a and the safety domain 202b. In certain aspects, the PMIC 218 may include monitoring circuitry 228 that monitors the correct operation of the PMIC 218 (or certain components of the PMIC 218). In certain cases, the monitoring circuitry 228 may undergo a BIST to ensure the monitoring circuitry 228 is operating as expected, for example, correctly identifying an overvoltage or under-voltage (or an overcurrent or an undercurrent). To perform the BIST associated with the monitoring circuitry 228, a distributed BIST architecture may be employed.

The memory controller 210 may be a specialized hardware module configured to manage the flow of data to and from a memory 220. The memory controller 210 may include logic for interfacing with the memory 220, such as selecting a row and column in a cell array of the memory 220 corresponding to a memory location, reading or writing data to the memory location, etc. The memory 220 may be an on-chip component (e.g., on the substrate, die, integrated chip, etc.) of the SoC 200, or alternatively (as shown) an off-chip component.

The sensor controller 212 may manage the sensor data received from various sensors 222, such as the sensors 116. The sensor controller 212 may include circuitry for interfacing with the sensors 222. For example, the sensor controller 212 may receive sensor data from a tire pressure monitoring system and/or a radar sensor used for adaptive cruise control.

The driver assistance controller 214 may control certain driver assistance functions via a driver assistance module 224 (e.g., one or more actuators, relays, switches, etc.). For example, the driver assistance controller 214 may control the adaptive cruise control by controlling actuators coupled to the engine and/or braking system. In some cases, the driver assistance controller 214 may perform automated steering by controlling actuators attached to the steering system. It will be appreciated that the driver assistance controller 214 is merely an example, and the main domain 202a and/or the safety domain 202b may include a controller that interfaces with automated driving components in addition to or instead of the driver assistance controller 214.

The SoC 200 may also include additional hardware and/or software components that are suitable for collecting sensor data from sensors, including speakers, user interface elements (e.g., input buttons, touch screen display, etc.), microphone arrays, sensors for monitoring physical conditions (e.g., location, direction, motion, orientation, vibration, pressure, temperature, etc.), cameras, compasses, GPS receivers, communications circuitry (e.g., Bluetooth®, wireless local area network (WLAN), Long Term Evolution (LTE), Fifth Generation New Radio (5G NR), etc.), and other well-known components (e.g., accelerometer, etc.) of modern electronic devices.

Each of the processing domains may operate independently of the other domains. In some cases, each of the processing domains may be coupled to separate and independent external resources, such as a PMIC, memory, sensor(s), and driver assistance module(s). A particular external resource may be designed in accordance with an ASIL corresponding to the particular ASIL associated with the main domain 202a and/or the safety domain 202b to which the external resource is coupled. For example, the PMIC 218 may have the same ASIL as the main domain 202a, and the PMIC that provides power to the safety domain 202b may have the same ASIL as the safety domain 202b. The safety domain 202b may include the same or different processing resources and components as the main domain 202a as described herein with respect to the main domain 202a. For example, the safety domain 202b may include the processors 204, the system components and resources 206, the power management controller 208, the memory controller 210, the sensor controller 212, and the driver assistance controller 214. The safety domain 202b may be coupled to certain external resource(s) 226, which may be representative of a PMIC, memory, sensors, and/or driver assistance module, for example, as described herein with respect to the main domain 202a.

It will be appreciated that the SoC 200 having separate domains, such as a main domain and a safety domain, is merely an example. Aspects of the present disclosure may applied to performing a distributed BIST as further described herein for other electrical component(s), such as a SoC having a single domain or more than two domains. In addition to the SoC 200 discussed above, various aspects may be implemented in a wide variety of computing systems, which may include a single processor, multiple processors, multicore processors, or any combination thereof.

Aspects Related To BIST Enhancements

As noted above, increased design complexity in certain devices, such as advanced automotive SoCs, generally increases the amount of code memory for BISTs. such as LBISTs and memory BISTs. While concurrent execution of BIST patterns may help reduce execution time, without proper power consideration, concurrent execution may led to excess current consumption.

Aspects of the present disclosure, however, may help address these issues by proposing enhanced BIST functionality. As an example, certain aspects of the present disclosure propose a BIST compression scheme that may significantly reduce the amount of memory involved (e.g., for core source code). As another example, certain aspects of the present disclosure provide mechanisms for scheduling concurrent BIST execution that may significantly reduce execution time. In some cases, such mechanisms may take power consumption into consideration, which may help achieve reductions in execution time while still avoiding excess current consumption.

Figure 3:
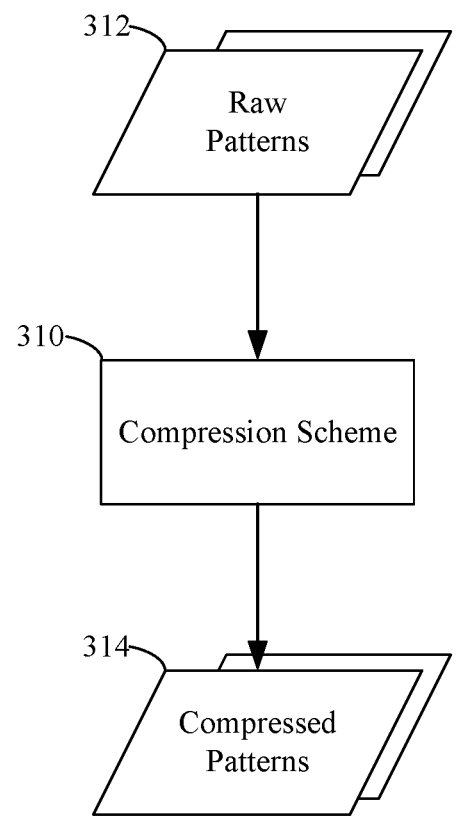
FIG. 3 depicts an example scheme for compressing raw BIST patterns to generate compressed BIST patterns, in accordance with aspects of the present disclosure.

FIG. 3 illustrates one example of a BIST compression scheme 310, in accordance with aspects of the present disclosure. As illustrated, the BIST compression scheme 310 takes raw BIST patterns 312 and generates compressed BIST patterns 314.

Each BIST pattern may include a series of instructions, such as Write instructions, Delays, Read (and Comparison) instructions, and Block ID instructions. The Write and Read instructions may target different types of registers, such as configuration (CONFIG) and data registers. The delay instructions may be based on known granularities, such as bus (e.g., advanced peripheral bus/APB or Joint Test Action Group/JTAG) clock cycles.

The compressed BIST patterns may take significantly less memory than the raw BIST patterns. As will be described in greater detail below, the compressed BIST patterns, along with a relative efficient decompression scheme, may allow BIST execution with a relatively low memory footprint for core source code. The compression schemes proposed herein may allow for efficient BIST pattern decompression and execution, with relatively simple debugging.

In some cases, the BIST compression scheme proposed herein may compress individual instructions of a raw BIST pattern, based on a fixed number of bytes. For example, FIG. 4 illustrates an example of a compressed instruction 400, generated based on a 5-byte BIST compression scheme. As illustrated, the compressed instruction 400 includes an ID field 410 and at most 4 bytes of data. As will be described in greater detail below, the number of data bytes may depend on the number of non-zero data bytes in the operand of the instruction being compressed, such that the amount of compression realized may depend on the actual value of the data in the instruction.

As illustrated, the ID field 410 may have 8 bits and essentially encodes sufficient information to allow decompression of the compressed instruction. As illustrated, a first set of bits 412 may identify the type of instruction (being compressed/decompressed), at least one bit 414 that may indicate how to interpret the first set of bits 412, at least one bit 416 that indicates a type of register, and a set of bits 418 that indicate non-zero byte locations of the (original) instruction data field.

Figure 5:
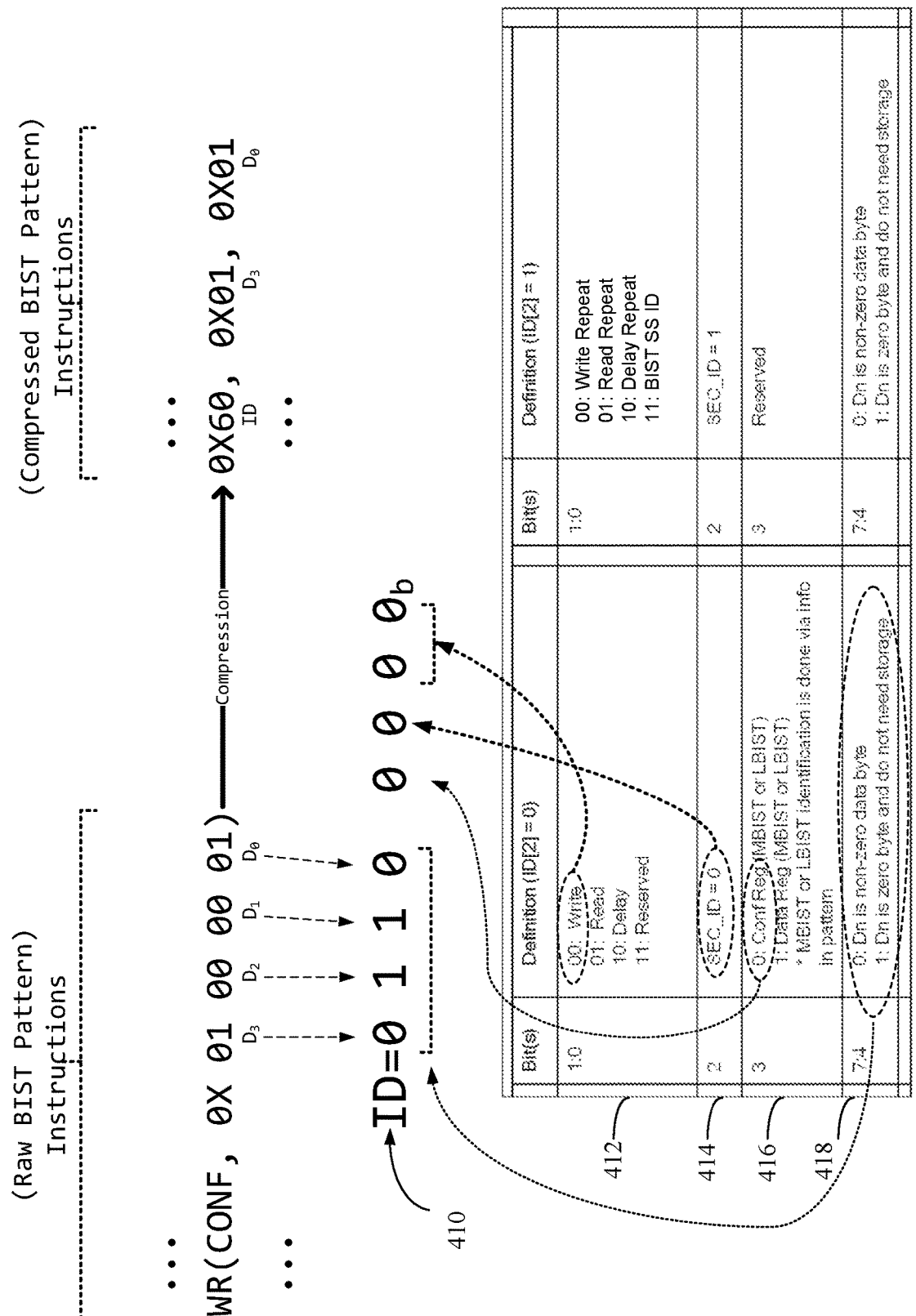
FIG. 5 depicts an example identifier (ID) field for BIST pattern compression, in accordance with aspects of the present disclosure.

Generation and functionality of ID field 410 may be understood with reference to FIG. 5, which shows an example of how a write instruction may be compressed using an example compression scheme proposed herein.

The example assumes an instruction to perform a Write operation to a configuration register, with a 4-byte data field, with two non-zero bytes. As illustrated, the first two bits 412 of the ID field are set (e.g., to binary values 0b00 as in the illustrated example) to indicate a Write instruction, while bit 416 is set (to 0b0) to indicate a Configuration register. It should be noted that bit 414 is set to 0b0 to indicate the definition of bits 412 and 416, as indicated in the left hand column. This approach provides flexibility and support of other instruction types. For example, as shown, bit 414 can be set differently (to 0b1) to indicate bits 412 should map to a different set of instructions.

Bits 418 of ID field 410 generally contain information (a descriptor) of the kind of information contained in the 4 byte data field of the original instruction. For example, bits 418 can indicate what data byte locations of the data field of the original instruction, if any, contain non-zero data. In the illustrated example, the data field of the original instruction includes two non-zero data bytes ($D_0$ and $D_3$). Thus, the first and last bits of bits 418 (bits 4 and 7 of ID field 410) are set (to 0b0) to indicate non-zero data bytes in these locations, while the other two bits (bits 5 and 6 of ID field 410) are set (to 0b1) to indicate zero data bytes in the other locations ($D_1$ and $D_2$).

Thus, the compression scheme proposed herein may be based around the number of bytes containing "no information" or all-zeros, meaning these bytes do not need to be stored. This results in up to 4 bytes of compression each instruction and allows the original data field to be reconstructed upon decompression, by indicating the byte location of any stored non-zero data, as well as the byte location of zero data bytes that were stored. In the example illustrated in FIG. 5, bits 418 (ID bits 4:7) are set to binary values (0b0110 in the illustrated example) indicating non-zero data bytes are stored for data bytes $D_0$ and $D_3$. Therefore, the compressed instruction includes the ID field (binary 0b0110 0000 or hexadecimal 0x60) and non-zero data fields $D_0$ and $D_3$, both having non-zero values of 0x01 in this example. Thus, in this example, the compressed instruction requires two less bytes of memory for storing the corresponding 4 bytes of the data field of the original instruction.

Figure 6:
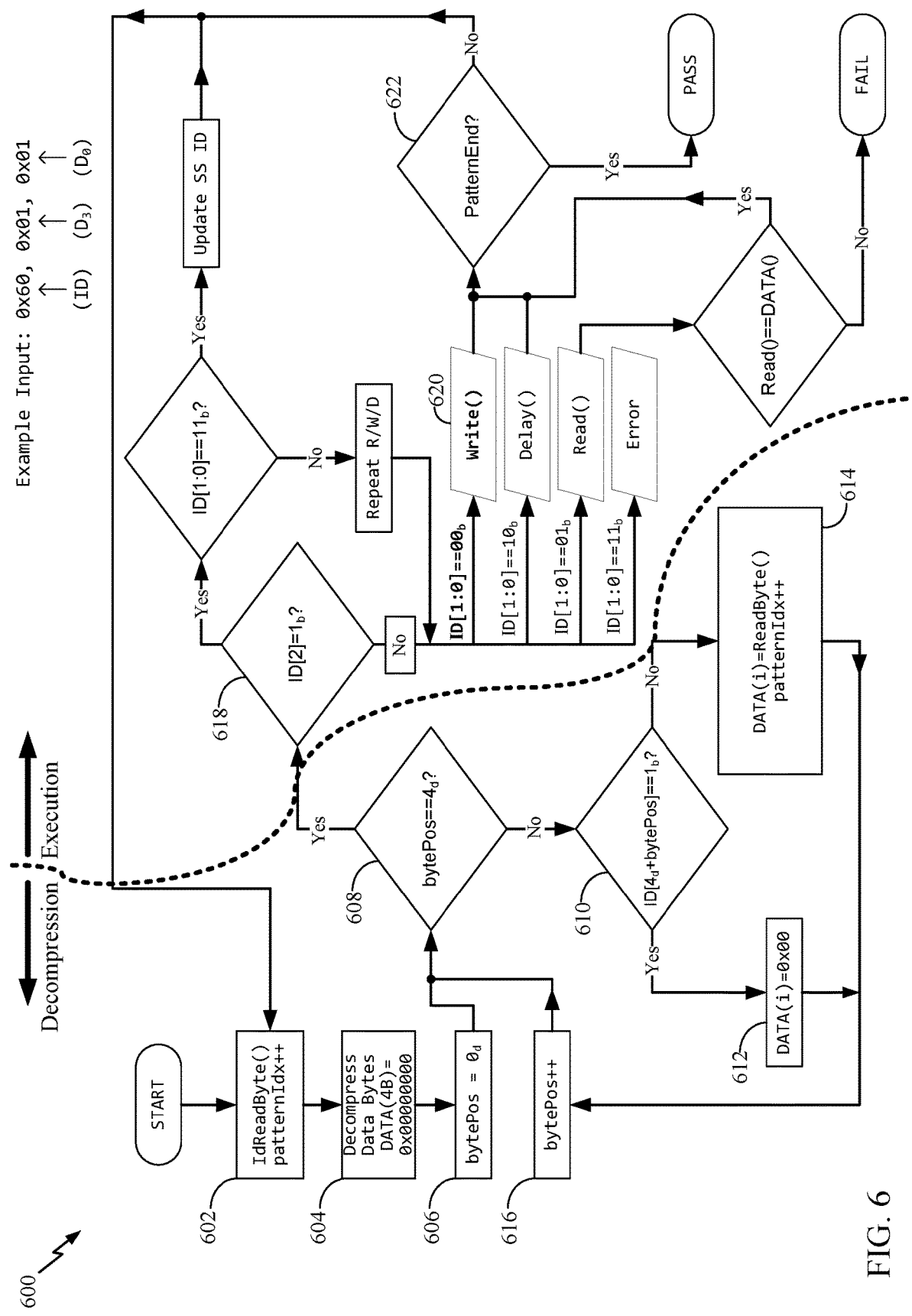
FIG. 6 depicts an example flow diagram for BIST pattern decompression and execution, in accordance with aspects of the present disclosure.

FIG. 6 depicts an example flow diagram 600 for a compressed BIST pattern decompression and execution scheme. As will be shown later, the decompression scheme described in FIG. 6 may allow for relatively quick and accurate decoding compressed BIST instructions (of a compressed BIST pattern) with minimal overhead.

As indicated by the arrows, a first part of the flow diagram (left hand side blocks 602-616) performs operations to decompress compressed instructions, while a second part of the flow diagram (right hand side blocks 618-636) performs operations to execute the decompressed instructions.

Figure 7:
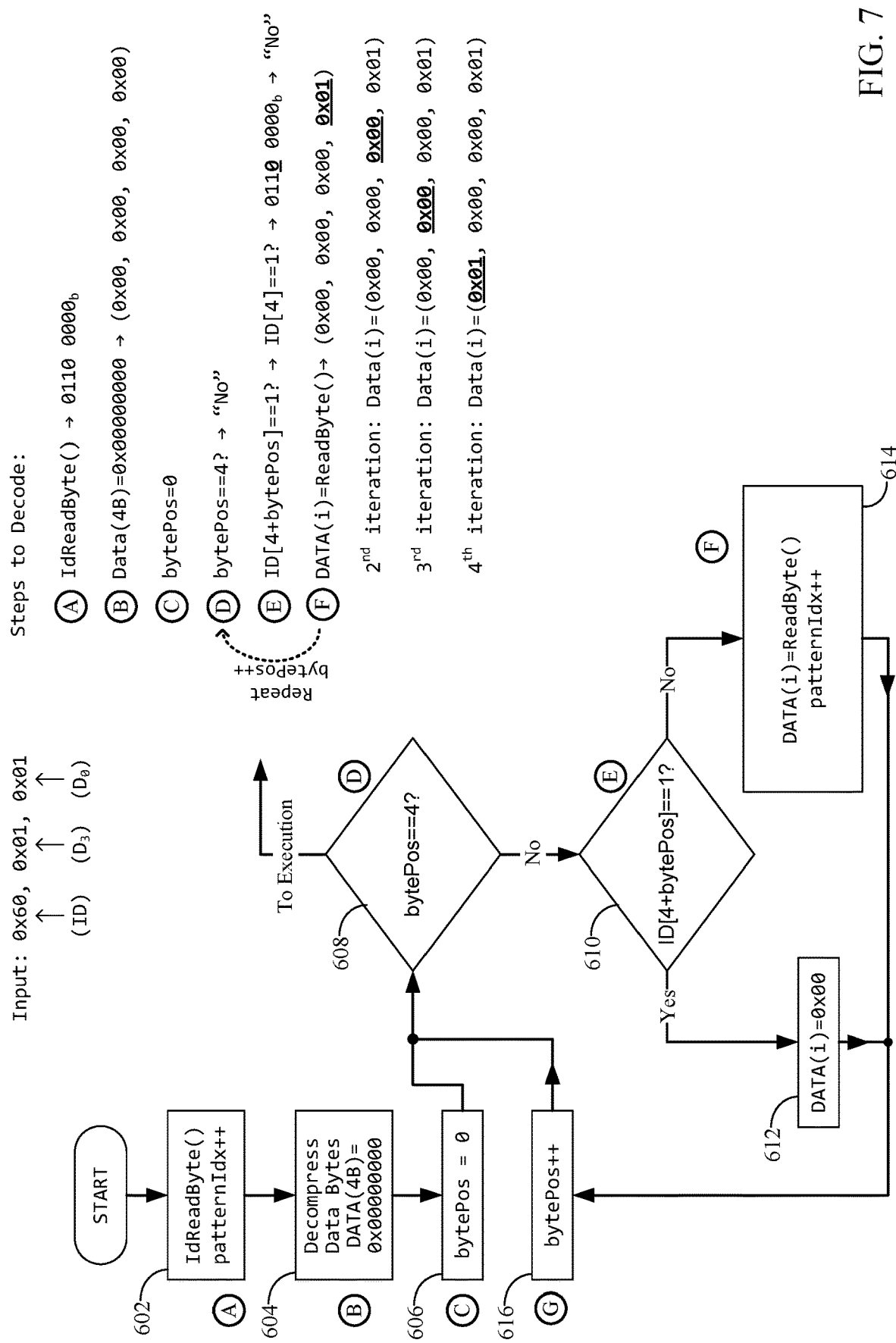
FIG. 7 depicts an example flow diagram for BIST pattern decompression, in accordance with aspects of the present disclosure.

The decompression operations may be understood by considering the example shown in FIG. 7 that illustrates how the compressed instruction described in FIG. 5 (stored as 0x60, 0x01, 0x01) is decompressed.

As described above, the ID field of the compressed instruction efficiently describes the type of the original instruction, the register type, and the composition of the original (4 byte) data field (location of non-zero data bytes), which is stored as 4 bytes or less in the compressed instruction.

At 602, the ID field byte is read and a pattern ID index (patternIDx) is incremented. As indicated at (A), in this example, the ID field is 0x60 (0110 0000). At 604, a 4 byte variable is initialized to all-zeros. As indicated at (B) Data=0x000000.A byte position counter (bytePos) is initialized to 0 at 606).

The data field of the original instruction is then reconstructed, based on the data field byte(s) stored with the compressed instruction (0x01, 0x01 in this example) and bits 4-7 of the ID field (0b0110 in this example).

At 608, the decompression scheme evaluates whether the byte position counter is equal to 4 (as indicated at (D)), signifying that the decompression scheme had decoded the last bit ($b_7$) of the 1-byte ID field. If so, reconstruction of the data field of the original instruction is complete and the Yes branch is taken to decode the remaining bits 0-3 of the ID field to execute the original instruction.

For the first iteration, as indicated at (E) bytePos=0, so bit 4 of the ID field is evaluated at 610. Since this bit is zero, which indicates a non-zero data byte for D0, the No branch is taken and, at 614, the decompression scheme stores the first non-zero data byte of the compressed data field (0x01) into the corresponding byte of the 4-byte Data field ($D_0$=0x01, such that Data=0x00000001 as shown at (F)).

The remaining bits (5-7) of the ID field are evaluated in a similar manner, by incrementing the byte position counter, at 616, and repeating operations 608-614, until all four bytes of the data field of the original instruction is reconstructed (as indicated by bytePos=4). As indicated at 612, if an ID field bit indicates a zero data byte (e.g., bit 5 if the ID field=1), the decompression scheme leaves the corresponding data byte as 0x00.

As indicated, after decompression is complete (after four iterations), the original four bytes of the data field (0x01000001 in this example) has been accurately reconstructed from the two non-zero bytes stored with the compressed instruction.

Referring back to FIG. 6, having reconstructed the data field, the remaining portion of the ID field can be decoded to obtain the original instruction for execution. As discussed, bit 2 of the ID field may determine how to interpret the first two bits of the ID field, bits 1 and 0. As shown at 618, if bit 2 of the ID field is 1 (ID[2]≤1), the Yes branch is taken and the first two bits of the ID field are interpreted according to the right hand side of the table in FIG. 4.

Continuing with the current example, where ID=0x60, bit 2 of the ID field is 0 (ID[2]=0), so the No branch is taken at 618 and the first two bits of the ID field are interpreted according to the left hand side of the table in FIG. 4. In the current example, the first two bits are both zero (ID[1:0] ≤b'00'), indicating a Write instruction. Therefore, a Write operation is performed, at 620, writing the reconstructed data field of 0x01000001 to a Configuration register (as indicated by ID[3]≤0).

The decompression and execution operations described herein may be repeated for each compressed instruction, until the end of the compressed BIST pattern is reached, as determined at 622.

As noted above, certain aspects of the present disclosure provide mechanisms for scheduling concurrent BIST execution that may significantly reduce execution time, when compared to sequential only BIST execution.

In some cases, a concurrent scheduling algorithm may help to efficiently deploy a plurality of logical built-in self-tests (LBISTs) to be run on processing cores distributed across multiple subsystems, based on which processing core has a longest remaining test time among a set of the processing cores that are waiting in a scheduler queue to access a server interface for LBIST dispatch.

Figure 8:
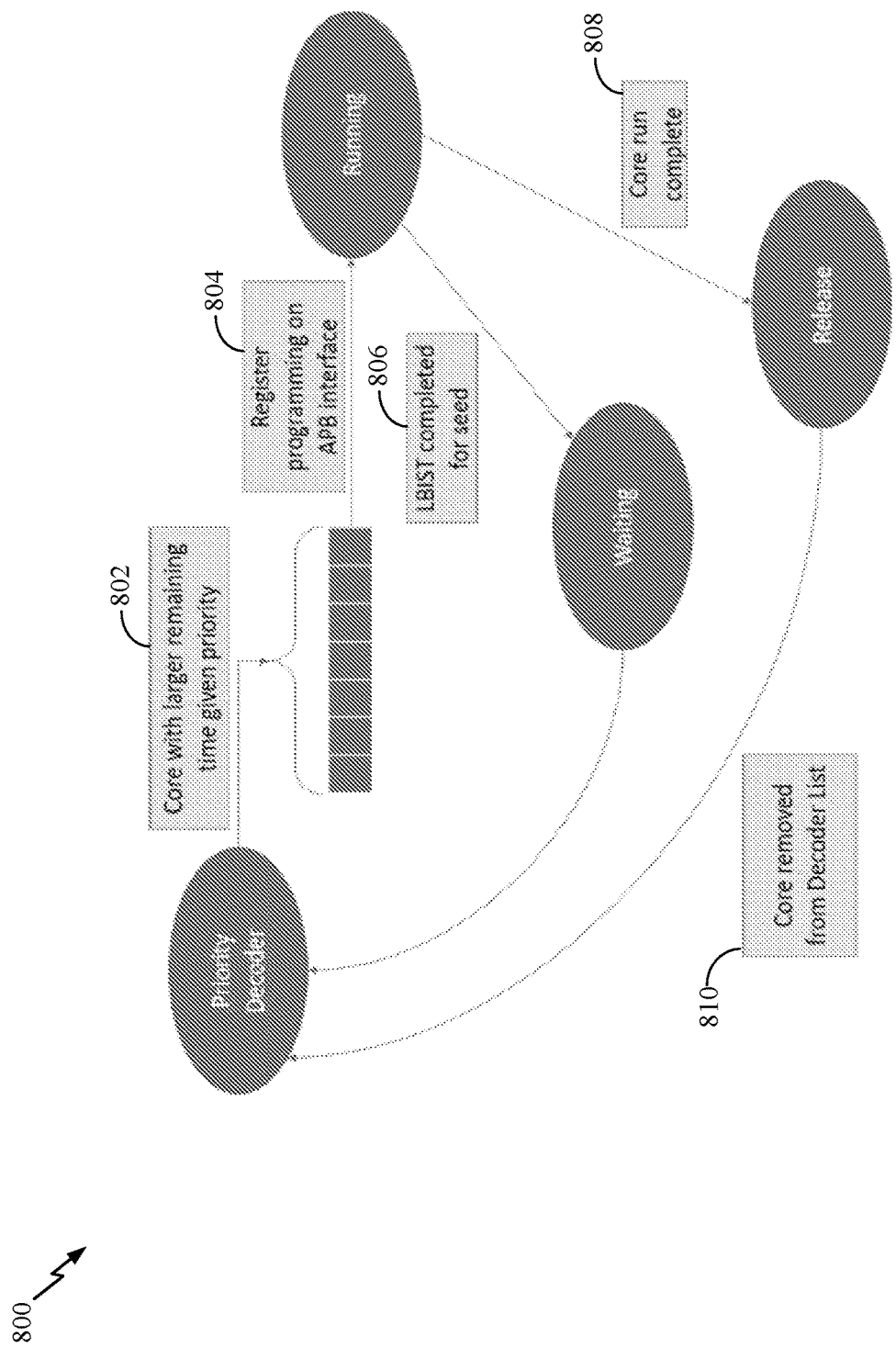
FIG. 8 depicts an example state diagram for scheduling concurrent execution of BIST patterns, in accordance with aspects of the present disclosure.

FIG. 8 depicts an example state diagram 800 for LBIST deployment across multiple cores distributed across multiple subsystems. As illustrated, cores may be in one of three states: Waiting. Running, and Release. In the Waiting state, a core may be waiting in a scheduler queue for LBIST dispatch. In the Running state, a core may be actually executing an LBIST (before returning to the Waiting state.) From the Running state, a core me either (re)enter the Waiting state (after completing an LBIST, as shown at 806), or enter the Released state after it is finished (e.g., running all LBIST for all seeds, as shown at 808), after which the core is removed from the decoder list, as shown at 810.

The concurrency algorithm proposed herein may be implemented as a priority decoder. As shown at 802, the concurrency algorithm may give priority to a core (waiting in the scheduler queue) with a longest remaining test time. As shown at 804, that core may be prioritized and registered for programming on a server interface, such as an advanced peripheral bus (APB) interface.

Generally. LBIST test time can divided into two parts, a programming portion (via the server interface) and an execution portion. The execution portion typically occupies more of the test time (e.g., up to 90%), while the programming portion takes much less (e.g., 10%). For the programming portion, the cores vie for the same server interface. Thus, the concurrency algorithm proposed herein may help reduce overall test time by optimizing server interface utilization to program multiple cores successively. The concurrency algorithm may be designed to minimize total test time, reduce device boot times, and meet tighter key performance indicators (KPIs).

The concurrency algorithm proposed herein may be understood with reference to the example shown in FIG. 9 and FIGS. 10A-10C.

Figure 9:
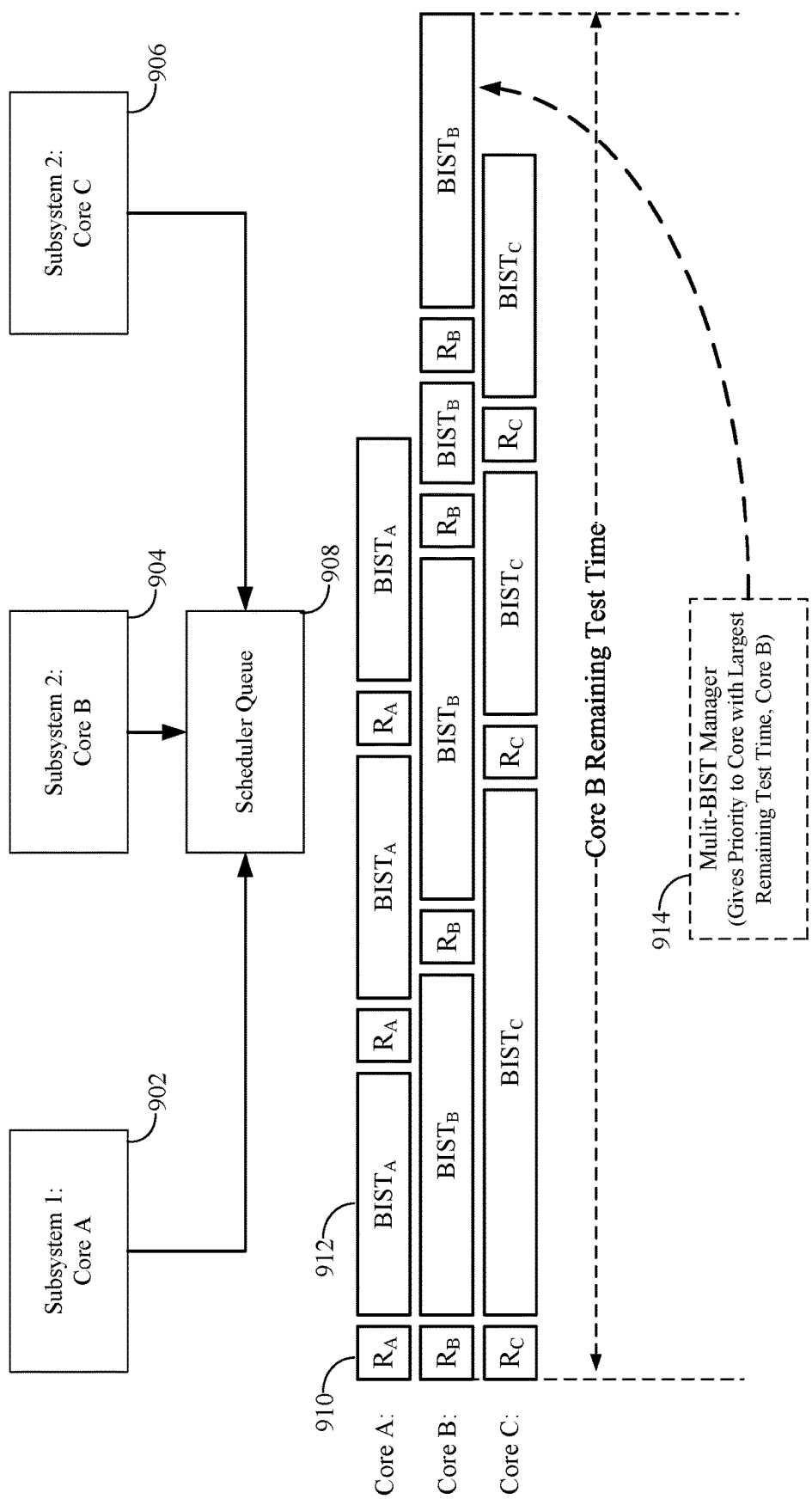
FIG. 9 depicts an example logical diagram for scheduling concurrent execution of BIST patterns, in accordance with aspects of the present disclosure.

In the example shown in FIG. 9, the concurrency algorithm (e.g., implemented in scheduler queue 908) scheduled LBIST execution across three subsystems (Core A 902, Core B 904, and Core C 906). As illustrated, LBIST programming may be preceded by LBIST execution. For example, a programming portion $R_A$ 910 may preceded execution of a BIST $BIST_A$ 912 on Core A. Similar programming portions (denoted $R_B$ and $R_C$) precede BIST execution ($BIST_B$ and $BIST_C$) on Core B and Core C.

Figure 10A:
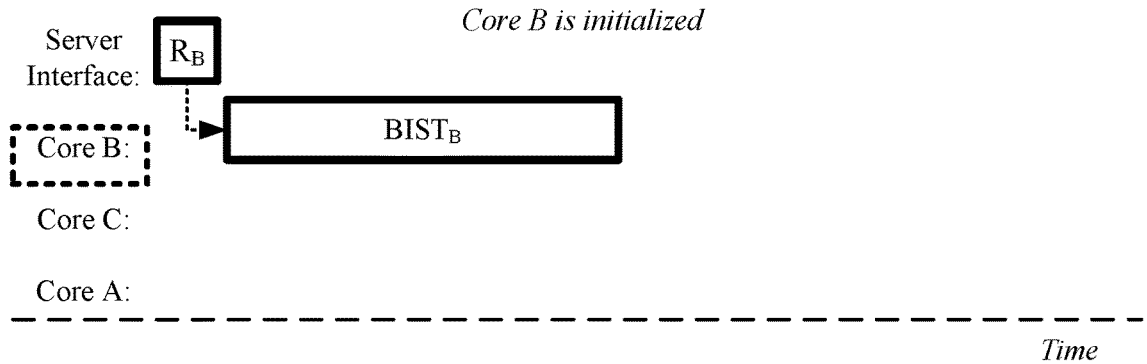
FIG. 10A, FIG. 10B, and FIG. 10C depict an example sequence for scheduling concurrent execution of BIST patterns, in accordance with aspects of the present disclosure.
Figure 10B:
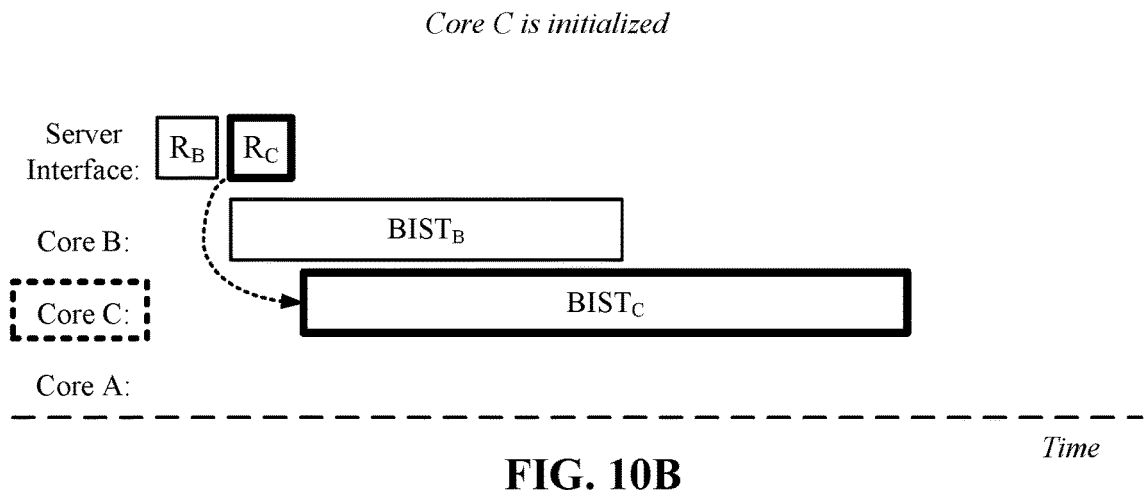
Figure 10C:
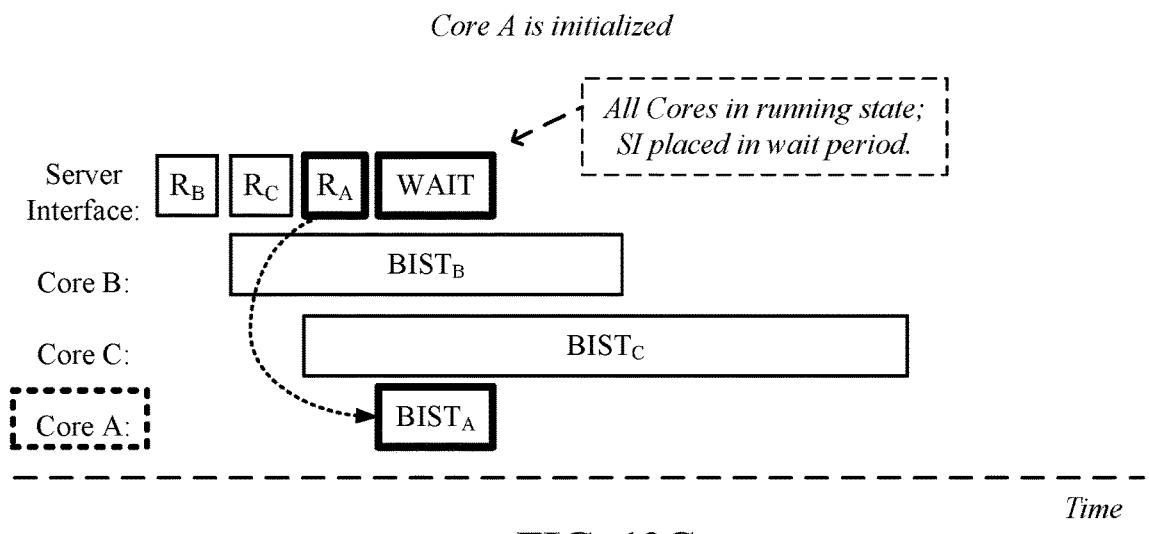

As shown at 914, the concurrency algorithm (which may be implemented by a Multi-BIST manager) may give priority to a core (waiting in the scheduler queue 908) with a largest remaining test time (Core B in this example). As shown in FIGS. 10A-10C. after giving one core priority and that core is running (executing a BIST after programming), the concurrency algorithm may prioritize the next core with the largest remaining test time.

Referring first to FIG. 10A, since Core B initially has the largest remaining test time (as shown in FIG. 9), Core B is given priority access to the server interface for programming ($R_B$), prior to execution (of a BIST denoted $BIST_B$).

The concurrency algorithm may then evaluates the remaining cores (Core A and Core C) in the scheduling queue for the longest remaining test time. Of the remaining cores, Core C has the longest remaining test time. Therefore, as shown at FIG. 10B, the concurrency algorithm gives Core C priority in the scheduler queue and to the server interface, for programming ($R_C$), prior to execution (of a BIST denoted $BIST_C$).

With Core B and Core C executing. Core A is the only remaining core in the scheduler queue. Therefore, as shown at FIG. 10C, the concurrency algorithm finally gives Core A priority in the Scheduler Queue and to the Server Interface, for programming ($R_A$), prior to execution (of a BIST denoted $BIST_A$). As shown, with all cores in a running state, the server interface may be placed in a Wait state. For example, the concurrency algorithm (or Multi-BIST Manager) may calculate a wait period, where the server interface may enter an idle (e.g., a low power) state until the earliest LBIST is completed and a core is again waiting in the scheduling queue and ready for the next LBIST dispatch.

As shown in FIGS. 10A-10C, by successively programming cores in this manner, server interface utilization may be increased. In other words, one core may be allowed to access the server interface for programming, while another core is running (executing a BIST). By iteratively giving priority to the processing core with the largest remaining test time, the access to the server interface may be optimized, which may help reduce overall test time.

In some cases, processing cores may share a common power domain (e.g., connected to the same power rails). In such cases, multiple cores operating (executing BISTs) in parallel, as shown in the example above, may lead to a high surge current in the power rail. If the maximum power (a power constraint) for a power domain is exceed, the voltage in that domain may drop and your LBIST will potentially fail resulting in a boot failure.

As noted above, however, certain aspects of the present disclosure provide mechanisms for scheduling concurrent BIST execution that take power consumption into consideration, which may help achieve reductions in execution time while still avoiding excess current consumption. As such, the power-aware concurrency algorithm proposed herein may help enable increased concurrency while optimizing utilization of available power, without exceeding a power constraint, which may help achieve a reduction in total test time with a reduced risk of boot failure.

Figure 11:
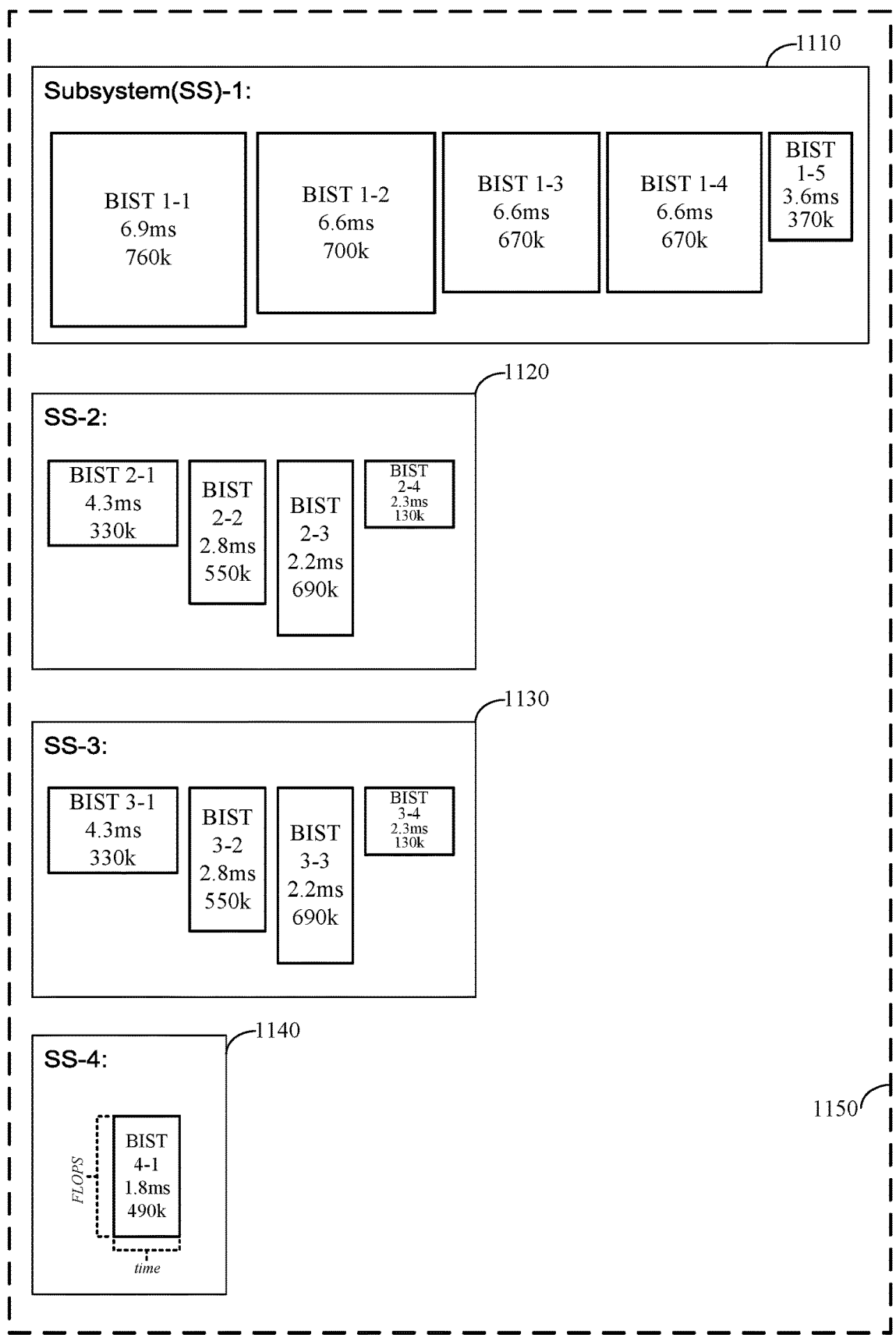
FIG. 11 depicts example BIST patterns, with corresponding power and processing times.
Figure 12:
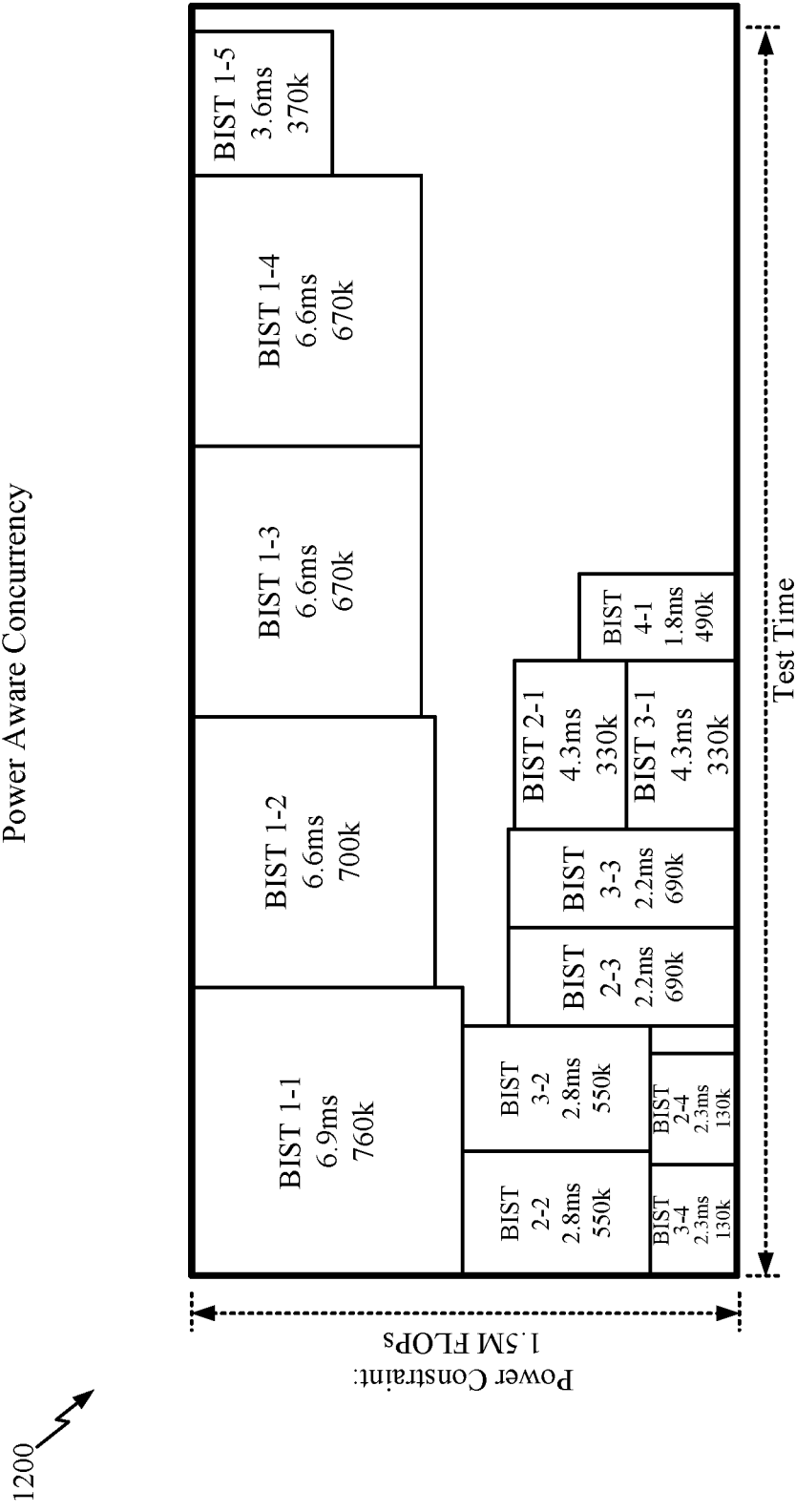
FIG. 12 depicts an example of power-aware concurrent scheduling of BIST pattern execution, in accordance with aspects of the present disclosure.
Figure 13:
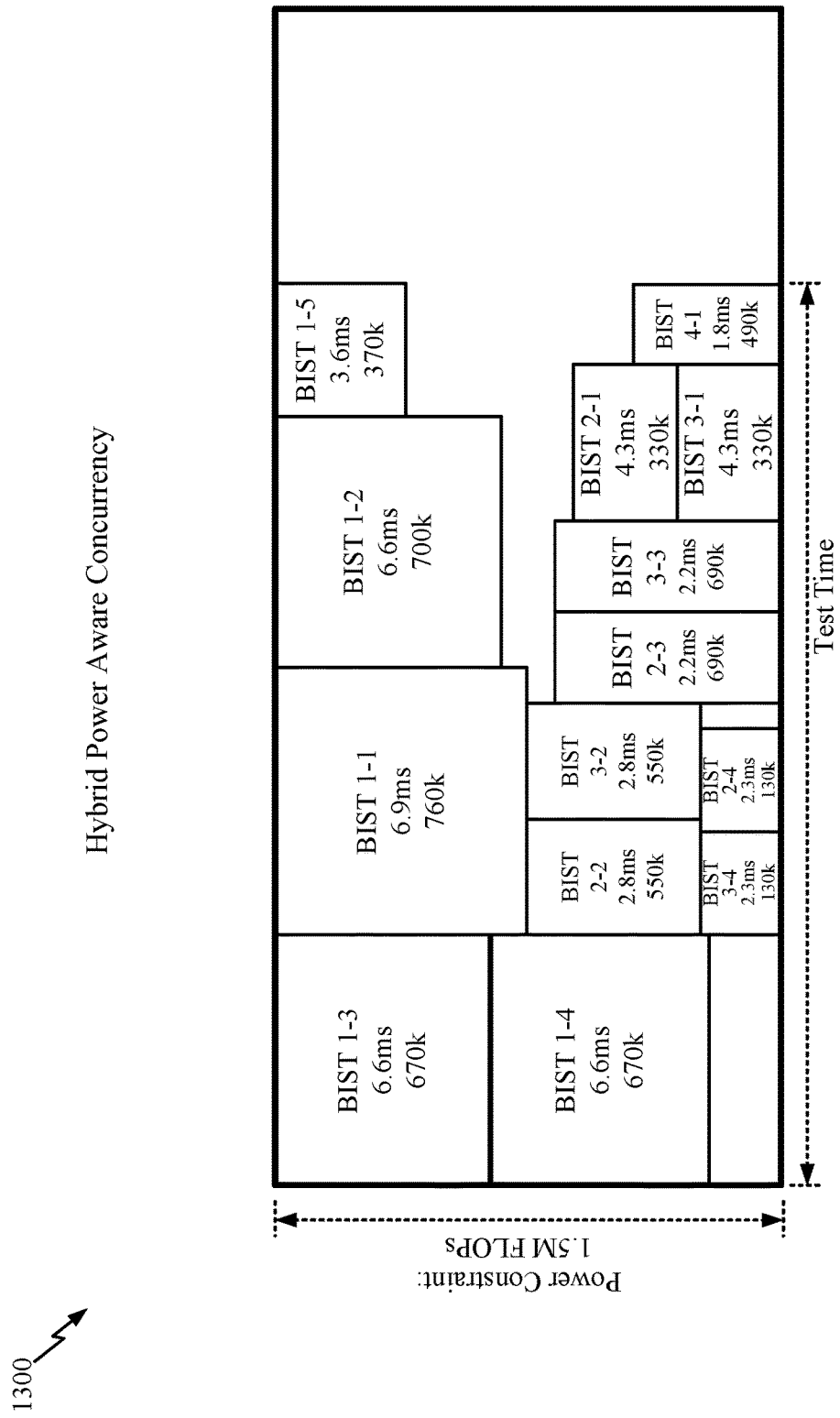
FIG. 13 depicts another example of power-aware concurrent scheduling of BIST pattern execution, in accordance with aspects of the present disclosure.

Such a power aware concurrent scheduling algorithm may be understood with reference to the example shown in FIGS. 11-13.

FIG. 11 illustrates an example of four subsystems (SSs), SS-1 1110, SS-2 1120, SS-3 1130, and SS-4 1140), that may share a common power domain (e.g., a power rail) 1150. Each subsystem may correspond to a different portion of logic, such as camera input, audio playback, video playback, and/or some type of sensor processing (e.g., to aid in autonomous driving).

Each subsystem may have a series of BISTs to complete. In the illustrated example, SS-1 has BIST 1-1 through BIST 1-5, SS-2 has BIST 2-1 through BIST 2-4, SS-3 may have BIST 3-1 through BIST 3-4, while SS-4 may have just one BIST 4-1.

When all four cores are operating simultaneously, they may collectively be executing a large numbers of Floating Point Operation per Second (FLOPS), which is proportional to power consumption. In other words, the higher the number of FLOPS, due to simultaneous execution of BISTs on different cores, the greater the power consumption within the shared power domain.

In the example depicted in FIG. 11, the various BISTs to be executed in the four subsystems are represented by a rectangular shape, the area of which generally represents a power consumption related metric for that BIST. For example, referring to BIST 4-1, the power consumption related metric may be based on the time required to complete BIST 4-1 and the FLOPS (e.g., the area=time×FLOPS), which generally represents the power consumption to execute BIST 4-1.

Using such a metric, a Multi-BIST Manager may employ a power-aware concurrency algorithm to sort the BISTs, for example, based on decreasing area (largest area to smallest metric/area) and prioritizes the core to initialize based on its area.

Such a power-aware concurrency algorithm may be understood with reference to the example diagram 1200 shown in FIG. 12 that schedules the BISTs shown in FIG. 11 for concurrent execution, based on a power constraint. The illustrated example assumes a power constraint of 1.5M FLOPS.

Prioritizing the BIST with the largest metric (area), BIST 1-1, the power-aware concurrency algorithm may attempt to schedule execution of as many concurrent BISTs to optimize available power, without exceeding the power constraint. In the illustrated example, the power-aware concurrency algorithm is able to schedule BIST 1-1 (on a core of SS-1), BIST 2-2 (on a core of SS-2), and BIST 3-4 (on a core of SS-3). As illustrated, this results in a total of 1.44 MFLOPS (760 k+550 k+130 k).

The power-aware concurrency algorithm may continue to schedule remaining BISTs in a similar manner, as BISTs complete and more power headroom becomes available. This may continue until all BISTs are complete, in a manner that generally achieves optimal utilization of a power limit, thereby increasing concurrency and reducing total test time.

According to certain aspects, total test time may be further reduced by implementing a hybrid power-aware concurrency algorithm that allows multiple cores to be executing in the same subsystem. This hybrid approach may provide additional scheduling flexibility which may allow the set of BISTs for a given subsystem to be completed sooner (than if only one core per subsystem were allowed to operate).

An example of this hybrid power-aware concurrency algorithm is shown in the example diagram 1300 FIG. 13, that also shows scheduling of the BISTs shown in FIG. 11 for concurrent execution, based on the same power constraint (1.5 MFLOPS).

Utilizing the hybrid power-aware concurrency algorithm, BIST 1-3 and BIST 1-4 may both be run concurrently (e.g., on multiple cores of SS-1), rather than sequentially as in the example of FIG. 12. As a result, when compared with the example shown in FIG. 12, the hybrid power-aware concurrency algorithm may significantly reduce total test time (e.g., from 30.3 ms to 23.7 ms), while still satisfying the power constraint.

Example Operations

Figure 14:
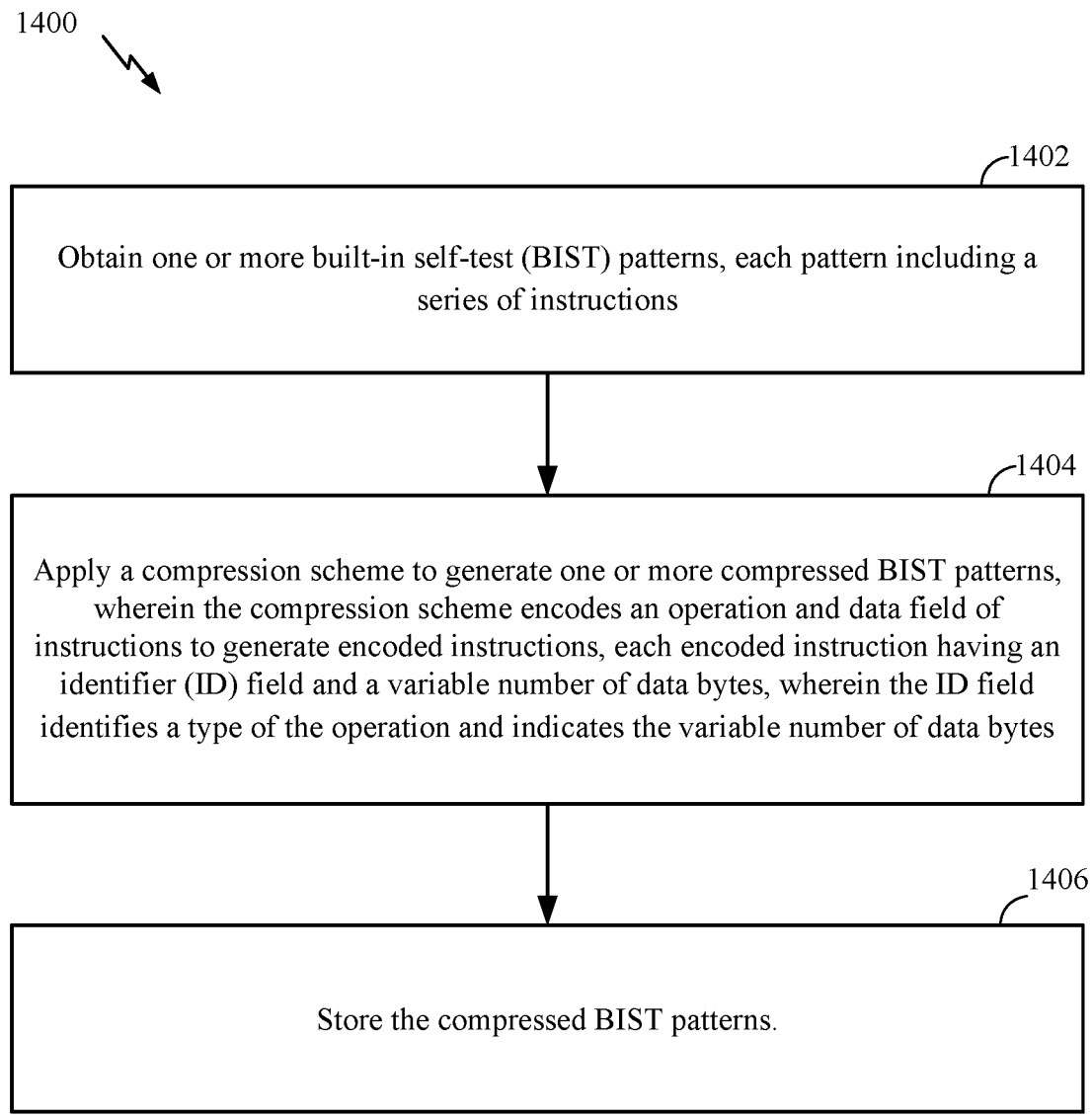
FIG. 14 depicts example operations for BIST pattern compression, in accordance with aspects of the present disclosure.

FIG. 14 shows a method 1400 for applying a compression scheme to generate one or more compressed BIST patterns. Operations of method 1400 may be performed by any of the components or processors described herein, such as those shown in FIG. 1 or FIG. 2.

Method 1400 begins, at 1402, by obtaining one or more built-in self-test (BIST) patterns, each pattern including a series of instructions. Method 1400 then proceeds to step 1404 by applying a compression scheme to generate one or more compressed BIST patterns, wherein the compression scheme encodes an operation and data field of instructions to generate encoded instructions, each encoded instruction having an identifier (ID) field and a variable number of data bytes, wherein the ID field identifies a type of the operation and indicates the variable number of data bytes. Method 1400 then proceeds to step 1406 by storing the compressed BIST patterns.

Figure 15:
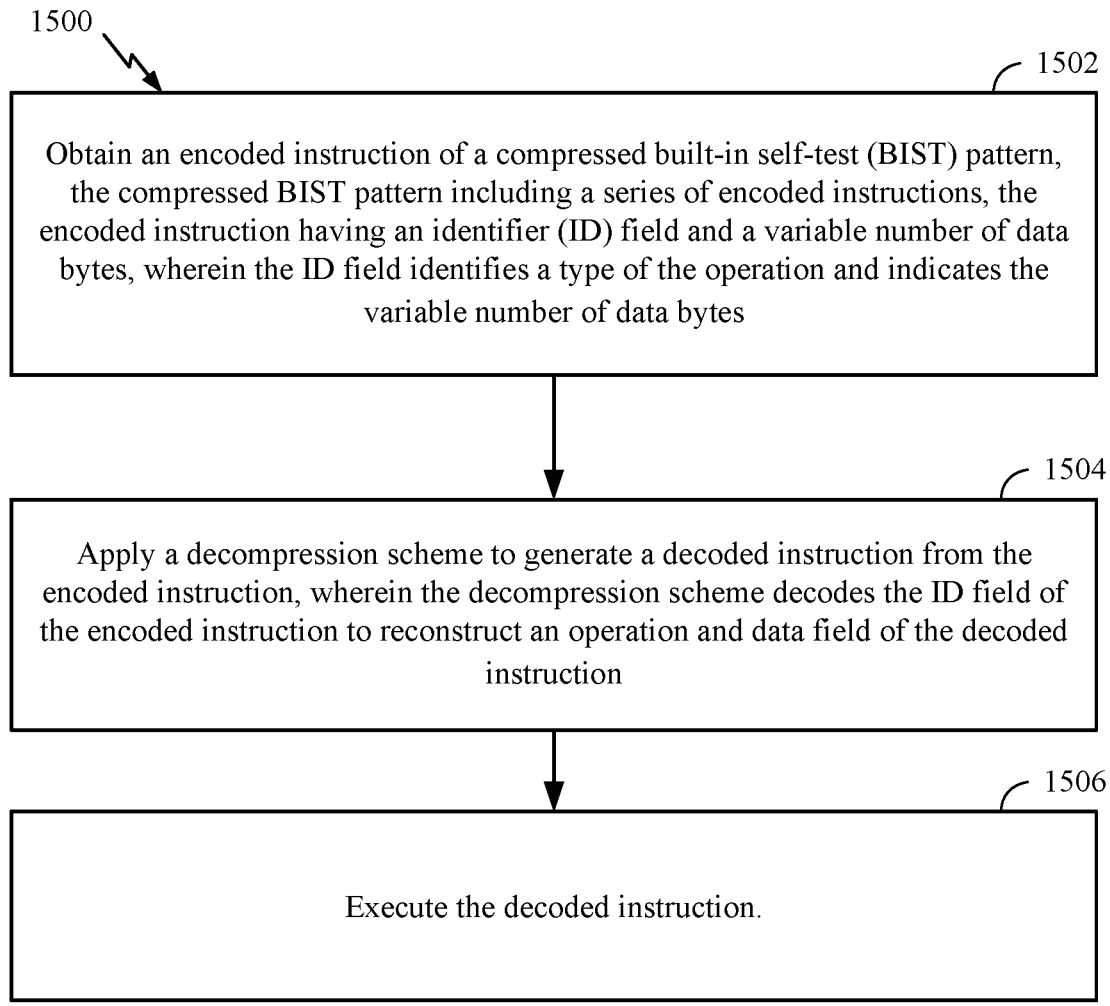
FIG. 15 depicts example operations for BIST pattern decompression, in accordance with aspects of the present disclosure.

FIG. 15 shows a method 1500 for applying a decompression scheme to recover a decoded instruction from a compressed (encoded) instruction. Operations of method 1500 may be performed by any of the components or processors described herein, such as those shown in FIG. 1 or FIG. 2.

Method 1500 begins at 1502 by obtaining an encoded instruction of a compressed built-in self-test (BIST) pattern, the compressed BIST pattern including a series of encoded instructions, the encoded instruction having an identifier (ID) field and a variable number of data bytes, wherein the ID field identifies a type of the operation and indicates the variable number of data bytes. Method 1500 then proceeds to step 1504 by applying a decompression scheme to generate a decoded instruction from the encoded instruction, wherein the decompression scheme decodes the ID field of the encoded instruction to reconstruct an operation and data field of the decoded instruction. Method 1500 then proceeds to step 1506 by executing the decoded instruction.

Figure 16:
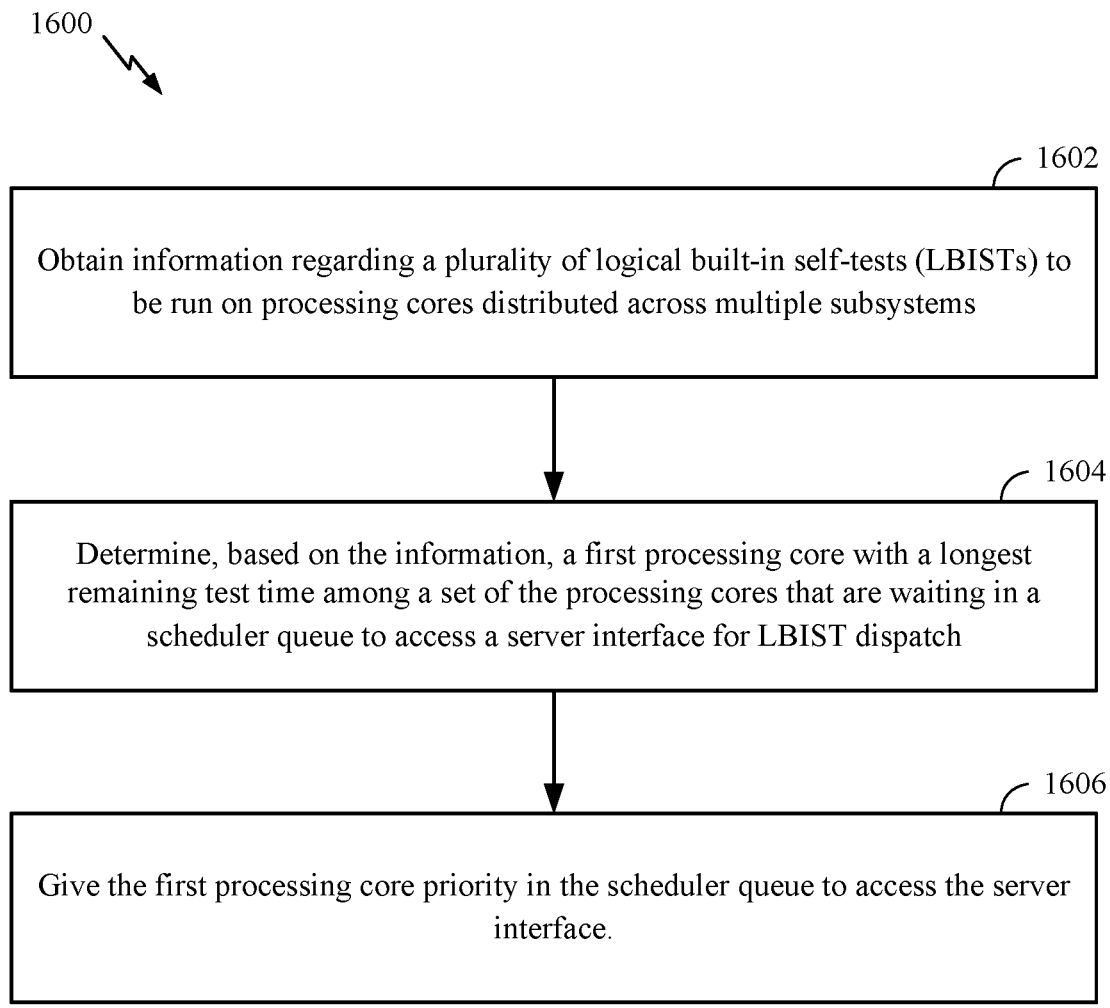
FIG. 16 depicts example operations for concurrent BIST execution scheduling, in accordance with aspects of the present disclosure.

FIG. 16 shows a method 1600 for concurrent BIST execution scheduling. Operations of method 1600 may be performed by any of the components or processors described herein, such as those shown in FIG. 1 or FIG. 2.

Method 1600 begins at 1602 by obtaining information regarding a plurality of logical built-in self-tests (LBISTs) to be run on processing cores distributed across multiple subsystems. Method 1600 then proceeds to step 1604 by determining, based on the information, a first processing core with a longest remaining test time among a set of the processing cores that are waiting in a scheduler queue to access a server interface for LBIST dispatch. Method 1600 then proceeds to step 1606 by giving the first processing core priority in the scheduler queue to access the server interface.

Figure 17:
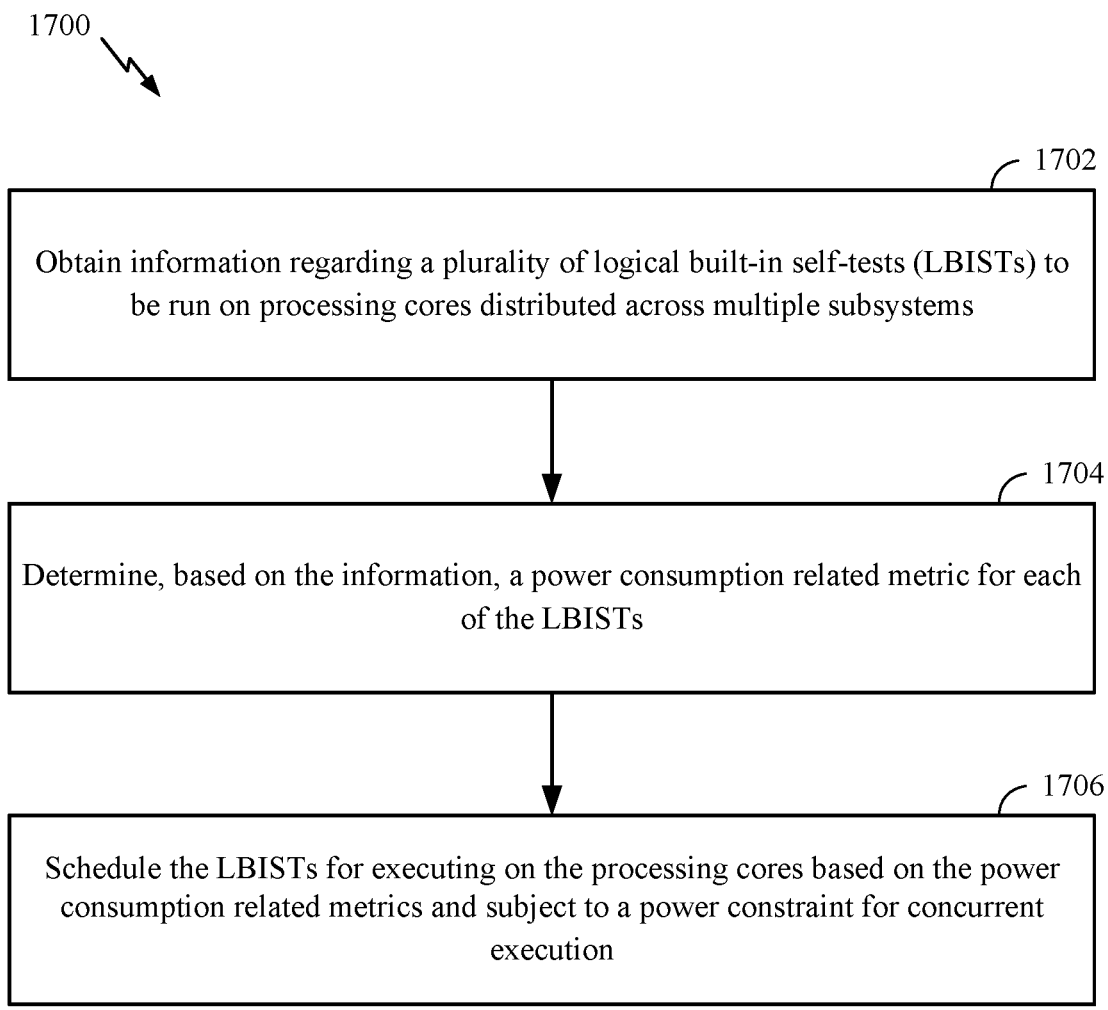
FIG. 17 depicts example operations for power-aware concurrent BIST execution scheduling, in accordance with aspects of the present disclosure.

FIG. 17 shows a method 1700 for power-aware concurrent BIST execution scheduling. Operations of method 1700 may be performed by any of the components or processors described herein, such as those shown in FIG. 1 or FIG. 2.

Method 1700 begins at 1702 by obtaining information regarding a plurality of logical built-in self-tests (LBISTs) to be run on processing cores distributed across multiple subsystems. Method 1700 then proceeds to step 1704 by determining, based on the information, a power consumption related metric for each of the LBISTs. Method 1700 then proceeds to step 1706 by scheduling the LBISTs for executing on the processing cores based on the power consumption related metrics and subject to a power constraint for concurrent execution.

Example Clauses

Implementation examples are described in the following numbered clauses:

Clause 1: A method, comprising: obtaining one or more built-in self-test (BIST) patterns, each pattern including a series of instructions; applying a compression scheme to generate one or more compressed BIST patterns, wherein the compression scheme encodes an operation and data field of instructions to generate encoded instructions, each encoded instruction having an identifier (ID) field and a variable number of data bytes, wherein the ID field identifies a type of the operation and indicates the variable number of data bytes; and storing the compressed BIST patterns.

Clause 2: The method of Clause 1, wherein the variable number of data bytes is less than or equal to a number of data bytes in the data field of the instruction being encoded.

Clause 3: The method of Clause 2, wherein: the ID field includes a number of bits that indicate positions of one or more non-zero data bytes of the data field of the instruction being encoded; and the variable number of data bytes includes the one or more non-zero data bytes.

Clause 4: The method of Clause 3, wherein: the number of bits also indicate positions of one or more zero data bytes of the data field of the instruction being encoded; and the variable number of data bytes does not include the one or more zero data bytes.

Clause 5: The method of any one of Clauses 1-4, wherein: the ID field includes a first number of bits that indicate the type of the operation of the instruction being encoded; and different combinations of values of the first number of bits indicate different types of operations.

Clause 6: The method of Clause 5, wherein the different types of operations include one or more of: a write operation, a read operation, a delay operation, a write repeat operation, a read repeat operation, or a delay repeat operation.

Clause 7: The method of Clause 5, wherein: the ID field also includes another bit; when the other bit is set to a first value, different combinations of values of the first number of bits indicate different types of operations from a first subset of operations; and when the other bit is set to a second value, different combinations of values of the first number of bits indicate different types of operations from a second subset of operations.

Clause 8: The method of any one of Clauses 1-7, wherein the ID field includes at least one bit that indicates a type of register involved in the operation of the instruction being encoded.

Clause 9: A method, comprising: obtaining an encoded instruction of a compressed built-in self-test (BIST) pattern, the compressed BIST pattern including a series of encoded instructions, the encoded instruction having an identifier (ID) field and a variable number of data bytes, wherein the ID field identifies a type of an operation and indicates the variable number of data bytes; applying a decompression scheme to generate a decoded instruction from the encoded instruction, wherein the decompression scheme decodes the ID field of the encoded instruction to reconstruct an operation and data field of the decoded instruction; and executing the decoded instruction.

Clause 10: The method of Clause 9, wherein the variable number of data bytes is less than or equal to a number of data bytes in the data field of the instruction being decoded.

Clause 11: The method of Clause 10, wherein: the ID field includes a number of bits that indicate positions of one or more non-zero data bytes of the data field of the instruction being decoded; the variable number of data bytes includes the one or more non-zero data bytes; and the decompression scheme reconstructs the data field of the instruction being decoded based on the variable number of data bytes and the indicated positions of the one or more non-zero data bytes.

Clause 12: The method of Clause 11, wherein: the number of bits also indicate positions of one or more zero data bytes of the data field of the instruction being decoded; the variable number of data bytes does not include the one or more zero data bytes; and the decompression scheme reconstructs the data field of the instruction being decoded by inserting the zero data bytes at the indicated positions of the one or more zero data bytes.

Clause 13: The method of any one of Clauses 9-12, wherein: the ID field includes a first number of bits that indicate the type of the operation of the instruction being decoded; and different combinations of values of the first number of bits indicate different types of operations.

Clause 14: The method of Clause 13, wherein the different types of operations include one or more of: a write operation, a read operation, a delay operation, a write repeat operation, a read repeat operation, or a delay repeat operation.

Clause 15: The method of Clause 13, wherein: the ID field also includes another bit; when the other bit is set to a first value, different combinations of values of the first number of bits indicate different types of operations from a first subset of operations; and when the other bit is set to a second value, different combinations of values of the first number of bits indicate different types of operations from a second subset of operations.

Clause 16: The method of any one of Clauses 9-15, wherein the ID field includes at least one bit that indicates a type of register involved in the operation of the instruction being decoded.

Clause 17: A method, comprising: obtaining information regarding a plurality of logical built-in self-tests (LBISTs) to be run on processing cores distributed across multiple subsystems; determining, based on the information, a first processing core with a longest remaining test time among a set of the processing cores that are waiting in a scheduler queue to access a server interface for LBIST dispatch; and giving the first processing core priority in the scheduler queue to access the server interface.

Clause 18: The method of Clause 17, further comprising: removing the first processing core from the scheduler queue after the first processing core has reached a running state with an LBIST running on the first processing core.

Clause 19: The method of Clause 18, further comprising: determining, from among remaining processing cores that are waiting in the scheduler queue to access the server interface for LBIST dispatch after removing the first processing core from the scheduler queue, a second processing core with a longest remaining test time among the remaining processing cores; and giving the second processing core priority in the scheduler queue to access the server interface.

Clause 20: The method of Clause 19, further comprising :: determining a wait period for which the server interface remains idle when there are no processing cores waiting in the scheduler queue to access the server interface for LBIST dispatch.

Clause 21: The method of Clause 19, wherein the interface remains idle until one of the processing cores finishes running an LBIST and has at least one more LBIST to run.

Clause 22: A method, comprising: obtaining information regarding a plurality of logical built-in self-tests (LBISTs) to be run on processing cores distributed across multiple subsystems; determining, based on the information, a power consumption related metric for each of the LBISTs; and scheduling the LBISTs for executing on the processing cores based on the power consumption related metrics and subject to a power constraint for concurrent execution.

Clause 23: The method of Clause 22, wherein the power consumption related metric is determined as a product of a test time and a parameter indicative of power consumed.

Clause 24: The method of Clause 23, wherein the parameter indicative of power consumed comprises floating point operations per second (FLOPs).

Clause 25: The method of Clause 24, wherein scheduling the LBISTs comprises sorting the power consumption related metrics and prioritizing LBISTs for execution in decreasing order.

Clause 26: The method of Clause 24, wherein scheduling is performed with an objective to increase concurrent execution of LBISTs on multiple cores, subject to the power constraint.

Clause 27: The method of Clause 26, wherein the power constraint relates to a maximum number of FLOPs.

Clause 28: The method of any one of Clauses 22-27, wherein the scheduling comprises scheduling multiple LBISTs to run concurrently on multiple cores in a same subsystem subject to the power constraint.

Clause 29: An apparatus, comprising: a memory comprising executable instructions; and a processor configured to execute the executable instructions and cause the apparatus to perform a method in accordance with any one of Clauses 1-28.

Clause 30: An apparatus, comprising means for performing a method in accordance with any one of Clauses 1-28.

Clause 31: A non-transitory computer-readable medium comprising executable instructions that, when executed by a processor of an apparatus, cause the apparatus to perform a method in accordance with any one of Clauses 1-28.

Clause 32: A computer program product embodied on a computer-readable storage medium comprising code for performing a method in accordance with any one of Clauses 1-28.

Additional Considerations

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A method, comprising:
   obtaining one or more built-in self-test (BIST) patterns, each pattern including a series of instructions;
   applying a compression scheme to the one or more BIST patterns to generate one or more compressed BIST patterns, wherein the compression scheme encodes an operation and a data field of the series of instructions to generate encoded instructions, each encoded instruction having an identifier (ID) field and a variable number of data bytes, wherein the ID field identifies a type of the operation and indicates the variable number of data bytes; and
   storing the one or more compressed BIST patterns.

2. The method of claim 1, wherein the variable number of data bytes is less than or equal to a number of data bytes in a data field of an instruction being encoded.

3. The method of claim 2, wherein:
   the ID field includes a number of bits that indicate positions of one or more non-zero data bytes of the data field of the instruction being encoded; and
   the variable number of data bytes includes the one or more non-zero data bytes.

4. The method of claim 2, wherein:
   the ID field includes a number of bits that indicate positions of one or more non-zero data bytes of the data field of the instruction being encoded;
   the number of bits also indicate positions of one or more zero data bytes of the data field of the instruction being encoded; and
   the variable number of data bytes does not include the one or more zero data bytes.

5. The method of claim 1, wherein:
   the ID field includes a first number of bits that indicate the type of the operation of an instruction being encoded; and
   different combinations of values of the first number of bits indicate different types of operations.

6. The method of claim 5, wherein the different types of operations include one or more of: a write operation, a read operation, a delay operation, a write repeat operation, a read repeat operation, or a delay repeat operation.

7. The method of claim 5, wherein:
   the ID field also includes another bit;
   when the other bit is set to a first value, different combinations of values of the first number of bits indicate different types of operations from a first subset of operations; and
   when the other bit is set to a second value, different combinations of values of the first number of bits indicate different types of operations from a second subset of operations.

8. The method of claim 1, wherein the ID field includes at least one bit that indicates a type of register involved in the operation of an instruction being encoded.

9. A method, comprising:
   obtaining an encoded instruction of a compressed built-in self-test (BIST) pattern, the compressed BIST pattern including a series of encoded instructions, the encoded instruction having an identifier (ID) field and a variable number of data bytes, wherein the ID field identifies a type of an operation and indicates the variable number of data bytes;

applying a decompression scheme to the BIST pattern to generate a decoded instruction from the encoded instruction, wherein the decompression scheme decodes the ID field of the encoded instruction to reconstruct an operation and data field of the decoded instruction; and executing the decoded instruction.

10. The method of claim 9, wherein the variable number of data bytes is less than or equal to a number of data bytes in the data field of an instruction being decoded.

11. The method of claim 10, wherein:
the ID field includes a number of bits that indicate positions of one or more non-zero data bytes of the data field of the instruction being decoded;
the variable number of data bytes includes the one or more non-zero data bytes; and
the decompression scheme reconstructs the data field of the instruction being decoded based on the variable number of data bytes and the indicated positions of the one or more non-zero data bytes.

12. The method of claim 10, wherein:
the ID field includes a number of bits that indicate positions of one or more non-zero data bytes of the data field of the instruction being decoded;
the number of bits also indicate positions of one or more zero data bytes of the data field of the instruction being decoded;
the variable number of data bytes does not include the one or more zero data bytes; and
the decompression scheme reconstructs the data field of the instruction being decoded by inserting the zero data bytes at the indicated positions of the one or more zero data bytes.

13. The method of claim 9, wherein:
the ID field includes a first number of bits that indicate the type of the operation of an instruction being decoded; and
different combinations of values of the first number of bits indicate different types of operations.

14. The method of claim 13, wherein the different types of operations include one or more of: a write operation, a read operation, a delay operation, a write repeat operation, a read repeat operation, or a delay repeat operation.

15. The method of claim 13, wherein:
the ID field also includes another bit;
when the other bit is set to a first value, different combinations of values of the first number of bits indicate different types of operations from a first subset of operations; and
when the other bit is set to a second value, different combinations of values of the first number of bits indicate different types of operations from a second subset of operations.

16. The method of claim 9, wherein the ID field includes at least one bit that indicates a type of register involved in the operation of an instruction being decoded.

17. An apparatus, comprising:
memory comprising executable instructions; and
one or more processors configured, individually or collectively, to execute the executable instructions and cause the apparatus to perform a method, the method comprising:

obtaining one or more built-in self-test (BIST) patterns, each pattern including a series of instructions;
applying a compression scheme to the one or more BIST patterns to generate one or more compressed BIST patterns, wherein the compression scheme encodes an operation and a data field of the series of instructions to generate encoded instructions, each encoded instruction having an identifier (ID) field and a variable number of data bytes, wherein the ID field identifies a type of the operation and indicates the variable number of data bytes; and
storing the one or more compressed BIST patterns.

18. The apparatus of claim 17, wherein the variable number of data bytes is less than or equal to a number of data bytes in a data field of an instruction being encoded.

19. The apparatus of claim 18, wherein:
the ID field includes a number of bits that indicate positions of one or more non-zero data bytes of the data field of the instruction being encoded; and
the variable number of data bytes includes the one or more non-zero data bytes.

20. The apparatus of claim 18, wherein:
the ID field includes a number of bits that indicate positions of one or more non-zero data bytes of the data field of the instruction being encoded;
the number of bits also indicate positions of one or more zero data bytes of the data field of the instruction being encoded; and
the variable number of data bytes does not include the one or more zero data bytes.

21. The apparatus of claim 17, wherein:
the ID field includes a first number of bits that indicate the type of the operation of an instruction being encoded; and
different combinations of values of the first number of bits indicate different types of operations.

22. The apparatus of claim 21, wherein the different types of operations include one or more of: a write operation, a read operation, a delay operation, a write repeat operation, a read repeat operation, or a delay repeat operation.

23. The apparatus of claim 21, wherein:
the ID field also includes another bit;
when the other bit is set to a first value, different combinations of values of the first number of bits indicate different types of operations from a first subset of operations; and
when the other bit is set to a second value, different combinations of values of the first number of bits indicate different types of operations from a second subset of operations.

24. An apparatus, comprising:
memory comprising executable instructions; and
one or more processors configured, individually or collectively, to execute the executable instructions and cause the apparatus to perform a method, the method comprising:
obtaining an encoded instruction of a compressed built-in self-test (BIST) pattern, the compressed BIST pattern including a series of encoded instructions, the encoded instruction having an identifier (ID) field and a variable number of data bytes, wherein the ID field identifies a type of an operation and indicates the variable number of data bytes;
applying a decompression scheme to the BIST pattern to generate a decoded instruction from the encoded instruction, wherein the decompression scheme decodes the ID field of the encoded instruction to reconstruct an operation and data field of the decoded instruction; and executing the decoded instruction.

25. The apparatus of claim 24, wherein the variable number of data bytes is less than or equal to a number of data bytes in the data field of an instruction being decoded.

26. The apparatus of claim 25, wherein:

the ID field includes a number of bits that indicate positions of one or more non-zero data bytes of the data field of the instruction being decoded;

the variable number of data bytes includes the one or more non-zero data bytes; and the decompression scheme reconstructs the data field of the instruction being decoded based on the variable number of data bytes and the indicated positions of the one or more non-zero data bytes.

27. The apparatus of claim 25, wherein:

the ID field includes a number of bits that indicate positions of one or more non-zero data bytes of the data field of the instruction being decoded;

the number of bits also indicate positions of one or more zero data bytes of the data field of the instruction being decoded;

the variable number of data bytes does not include the one or more zero data bytes; and the decompression scheme reconstructs the data field of the instruction being decoded by inserting the zero data bytes at the indicated positions of the one or more zero data bytes.

28. The apparatus of claim 24, wherein:

the ID field includes a first number of bits that indicate the type of the operation of an instruction being encoded; and different combinations of values of the first number of bits indicate different types of operations.

* * * * *